United States Patent
Yoon et al.

(10) Patent No.: US 8,338,224 B2
(45) Date of Patent: Dec. 25, 2012

(54) RESISTANCE-TYPE RANDOM ACCESS MEMORY DEVICE HAVING THREE-DIMENSIONAL BIT LINE AND WORD LINE PATTERNING

(75) Inventors: HongSik Yoon, Gyeonggi-do (KR); Ingyu Baek, Gyeonggi-do (KR); Hyunjun Sim, Gyeonggi-do (KR); Jin-Shi Zhao, Gyeonggi-do (KR); Minyoung Park, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 286 days.

(21) Appl. No.: 12/621,007

(22) Filed: Nov. 18, 2009

(65) Prior Publication Data

US 2010/0178729 A1    Jul. 15, 2010

(30) Foreign Application Priority Data

Jan. 13, 2009    (KR) ................... 10-2009-0002756

(51) Int. Cl.
*H01L 21/06*    (2006.01)
(52) U.S. Cl. .............. 438/102; 257/5; 257/E27.004; 257/E45.001
(58) Field of Classification Search ............. 438/102, 438/128; 257/5, E27.004, E45.001
See application file for complete search history.

(56) References Cited

U.S. PATENT DOCUMENTS

| | | |
|---|---|---|
| 2005/0230724 A1 | 10/2005 | Hsu |
| 2006/0250837 A1 | 11/2006 | Herner et al. |
| 2008/0026547 A1 | 1/2008 | Yin et al. |
| 2008/0128853 A1 | 6/2008 | Choi et al. |
| 2009/0141547 A1* | 6/2009 | Jin et al. ................. 438/102 |
| 2010/0226195 A1* | 9/2010 | Lue ................. 365/230.06 |

FOREIGN PATENT DOCUMENTS

| | | |
|---|---|---|
| JP | 2005-311322 | 11/2005 |
| JP | 2008-034809 | 2/2008 |
| KR | 1020080010621 A | 1/2008 |
| KR | 1020080043173 A | 5/2008 |

* cited by examiner

*Primary Examiner* — Zandra Smith
*Assistant Examiner* — Toniae Thomas
(74) *Attorney, Agent, or Firm* — Myers Bigel Sibley & Sajovec, P.A.

(57) ABSTRACT

Provided is a resistance random access memory device and a method of fabricating, the same. The method includes forming a bit-line stack in which a plurality of local bit-lines are vertically stacked on a substrate, forming a word-line including a plurality of local word-lines that extend in a vertical direction toward a side of the bit-line stack and a connection line that extends in a horizontal direction to connect the plurality of local word-lines with one another, and forming a resistance memory thin film between the bit-line stack and the word-line. The present inventive concept can realize a highly dense memory array with 3D cross-point architecture by simplified processes.

14 Claims, 31 Drawing Sheets

RESISTANCE-TYPE RANDOM ACCESS MEMORY DEVICE HAVING THREE-DIMENSIONAL BIT LINE AND WORD LINE PATTERNING

REFERENCE TO PRIORITY APPLICATION

This application claims priority to Korean Patent Application 10-2009-0002756, filed Jan. 13, 2009, the disclosure of which is hereby incorporated herein by reference.

FIELD OF THE INVENTION

The present invention relates to integrated circuit devices and, more particularly, to non-volatile memory devices having resistance-type memory cells therein.

BACKGROUND

Generally, resistance random access memory devices (ReRAMs), a type of nonvolatile memory utilize principles that electrical resistance characteristics are varied depending on an applied voltage. The ReRAMs are memory devices that make use of On/Off state of current according to the resistance variable characteristics due to the magnitude of the applied voltage. These ReRAMs have various advantages of relatively speedy access time, low power consumption, and reduction in process fault due to a simple memory cell structure.

As illustrated in FIG. 1A, an example of the ReRAMs is disclosed in U.S. Patent Application Publication No. 2006/0250837, entitled "NONVOLATILE MEMORY CELL COMPRISING A DIODE AND A RESISTANCE-SWITCHING MATERIAL", proposed by Herner et al.

Referring to FIG. 1A, a diode 16 and a resistance-switching element 18 are stacked between a bottom conductor 12 and a top conductor 14, thereby forming one memory layer 20. This memory layer 20 is stacked in plural, resulting in forming a highly dense monolithic three dimensional memory array. FIG. 1B schematically illustrates a resistance random access memory device 10 having the above-described monolithic three dimensional memory array.

With reference to FIG. 1B, when the resistance random access memory device 10 is embodied by forming a three dimensional memory array 30, the number of process steps required for stacking N memory layers may be equal to the value "N×S" that multiplies the number S of process steps required for defining a plurality of memory cell blocks by forming one memory layer 20 by the number N of stacked memory layers. That is, as the number of stacked layers increases, the number of process steps linearly increases.

The bottom conductor 12 and the top conductor 14 extend in an orthogonal direction, and a memory cell is formed at a cross-point therebetween. In general, the bottom conductor 12 may form word-lines, while the top conductor 14 may form bit-lines. For instance, when the number of word-lines 12 is K and the number of bit-lines 14 is M, the number of memory cell blocks, which is formed on one memory layer 20, may be K×M. In this case, when the number of stacked memory layers 20 is N, the number of memory cell blocks to be formed may be N×K×M.

The number of decoders required for accessing K×M memory cell blocks on one memory layer 20 may be the value "K+M" that is the sum of the number K of word-lines 12 and the number M of bit-lines 14. If N memory layers 20 are stacked, the number of decoders may be the value "(N×K)+(N×M)" that is the sum of the number "N×K" of stacked word-lines 12 and the number "N×M" of stacked bit-lines 14. That is, as the number of stacked layers increases, the number of decoders linearly increases. Accordingly, an area and the number of process steps are required for forming the decoders.

SUMMARY

An embodiment of the inventive concept provides a resistance random access memory device capable of realizing a highly dense memory array and a method of fabricating the same.

An embodiment of the inventive concept also provides a resistance random access memory device having bit-line stacks in which a plurality of local bit-lines are vertically stacked and comb-shaped word-lines in which a plurality of local word-lines provided vertically between the bit-line stacks are electrically connected to one another and a method of fabricating the same.

An embodiment of the inventive concept provides a method of fabricating a resistance random access memory device, the method including: forming a bit-line stack in which a plurality of local bit-lines are vertically stacked on a substrate; forming a word-line including a plurality of local word-lines that extend in a vertical direction toward a side of the bit-line stack and a connection line that extends in a horizontal direction to connect the plurality of local word-lines with one another; and forming a resistance memory thin film between the bit-line stack and the word-line.

In some embodiments, the method may further include: forming the bit-line stack; forming the resistance memory thin film that covers the bit-line stack; depositing a conductive material on the resistance memory thin film; and forming the word-line by patterning the conductive material.

In other embodiments, the method may further include: forming the bit-line stack; forming the resistance memory thin film that covers the bit-line stack; depositing an insulating material on the resistance memory thin film; forming a trench that exposes the resistance memory thin film by patterning the insulating material; and forming the word-line by depositing a conductive material in the trench.

In still other embodiments, the method may further include: forming the bit-line stack; depositing an insulating material on the substrate; forming a trench that exposes the bit-line stack by patterning the insulating material; forming the resistance memory thin film in the trench; and forming the word-line on the resistance memory thin film by depositing a conductive material in the trench.

In even other embodiments, the method may further include: forming a switching thin film between the resistance memory thin film and the word-line.

In other embodiments, the forming of the bit-line stack may include: forming a stacked body in which a plurality of insulating layers and a plurality of conductive layers are alternatively disposed on the substrate; forming a hard mask pattern on the stacked body; and patterning the stacked body by an etching using the hard mask pattern as a mask.

An embodiment of the inventive concept provides a resistance random access memory device including: a bit-line stack extending in a first horizontal direction and provided with a plurality of local bit-lines that are vertically stacked on a substrate; a word-line provided with a plurality of local word-lines that are vertically disposed at a side of the bit-line stack and a connection line that extends in a second horizontal direction intersecting the first horizontal direction to connect the plurality of local word-lines with one another; and a resistance memory thin film provided between the bit-line stack and the word-line.

In another embodiment, the connection line may be disposed across the bit-line stack.

In another embodiment, the bit-line stack may further include a hard mask pattern on the uppermost layer thereof.

In another embodiment, the resistance random access memory device may further include a switching thin film between the resistance memory thin film and the word-line.

BRIEF DESCRIPTION OF THE DRAWINGS

The accompanying drawings are included to provide a further understanding of the inventive concept, and are incorporated in and constitute a part of this specification. The drawings illustrate example embodiments of the inventive concept and, together with the description, serve to explain principles of the inventive concept. In the drawings.

DETAILED DESCRIPTION OF EMBODIMENTS

Figure 1A:
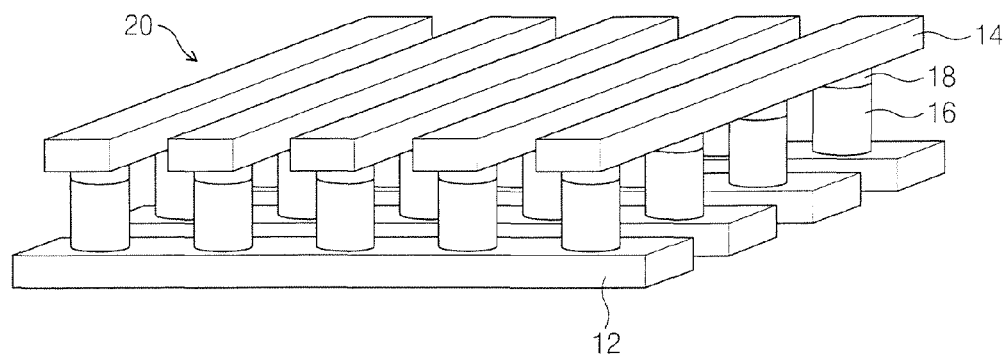
FIG. 1A is a perspective view illustrating a resistance random access memory device according to a conventional art.

Hereinafter, it will be described about a resistance random access memory device and a method of fabricating the resistance random access memory device according to exemplary embodiments of the present inventive concept in conjunction with the accompanying drawings.

Advantages and features of the present inventive concept and methods of accomplishing the same may be understood more readily by reference to the following detailed description of preferred embodiments and the accompanying drawings. The present inventive concept may, however, be embodied in many different forms and should not be construed as being limited to the embodiments set forth herein. Rather, these embodiments are provided so that this disclosure will be thorough and complete and will fully convey the concept of the inventive concept to those skilled in the art, and the present inventive concept will only be defined by the appended claims. Like reference numerals refer to like elements throughout the specification.

Equivalent Circuit Diagram

Figure 2A:
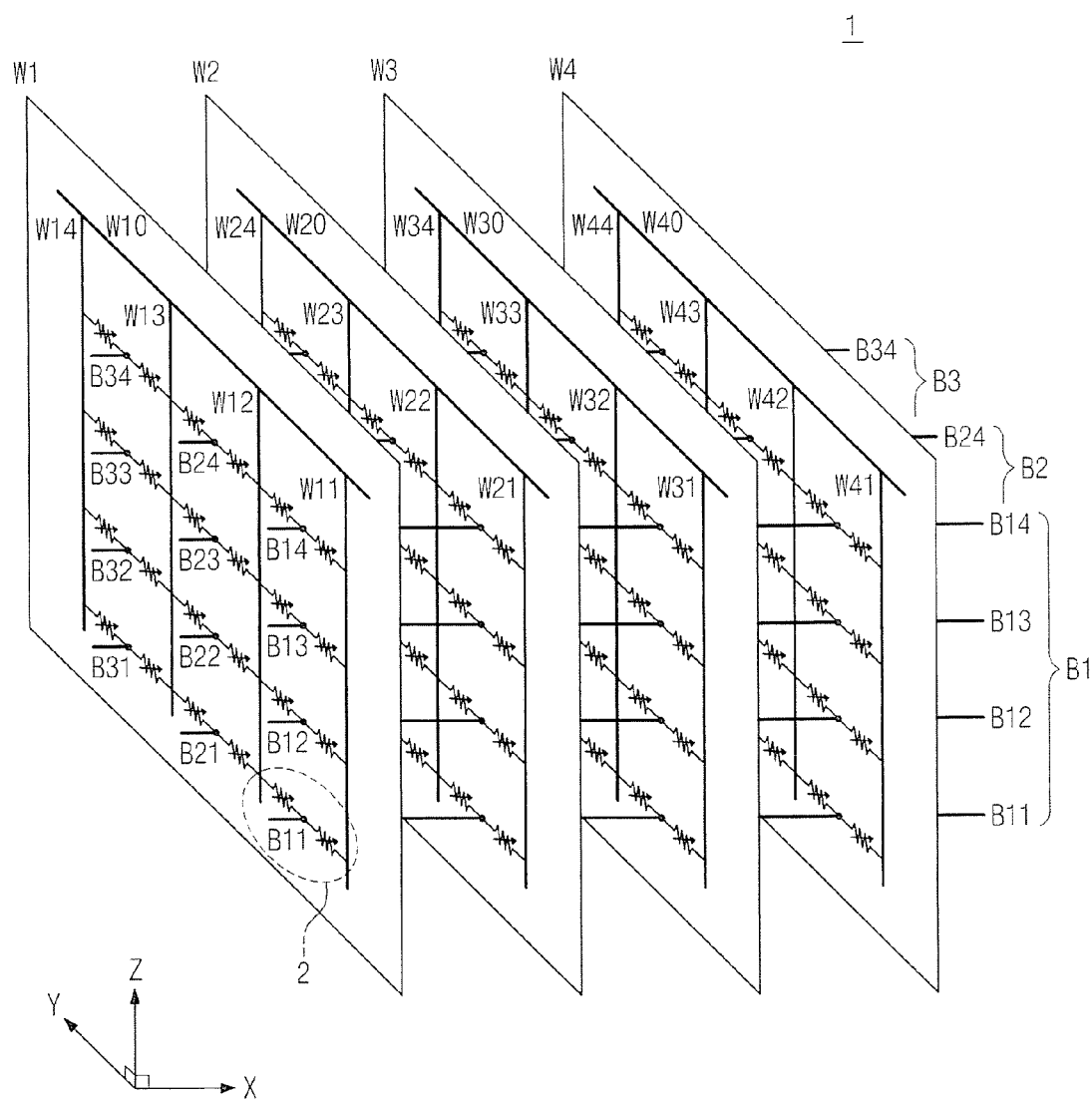
FIG. 2A is an equivalent circuit diagram illustrating a resistance random access memory device according to an exemplary embodiment of the present inventive concept.
Figure 2B:
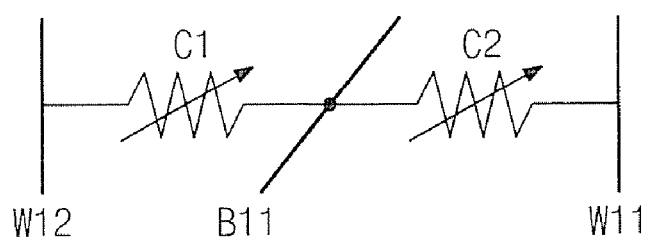
FIGS. 2B and 2C are circuit diagrams illustrating a part of the FIG. 2A.
Figure 2C:
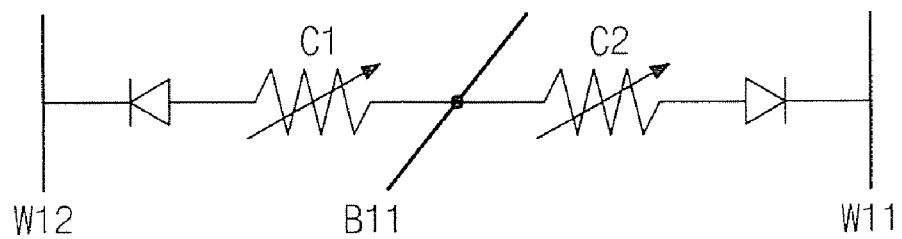

FIG. 2A is an equivalent circuit diagram illustrating a resistance random access memory device according to an exemplary embodiment of the present inventive concept; and FIGS. 2B and 2C are circuit diagrams illustrating a part of the FIG. 2A.

Referring to FIG. 2A, a resistance random access memory device 1 may include a three dimensional (3D) cross-point architecture. In this 3D cross-point architecture, each of memory cell blocks is defined in each of the cross-points between word-lines and bit-lines, and these memory cell blocks are three-dimensionally arranged.

For instance, the resistance random access memory device 1 may include a plurality of word-lines W1, W2, W3, and W4 to form a Y-Z plane and a plurality of bit-lines B1, B2, and B3 to form an X-Z plane. The word-lines W1 to W4 and the bit-lines B1 to B3 may act as electrodes. As another example, the resistance random access memory device 1 may include a plurality of bit-lines W1, W2, W3, and W4 to form a Y-Z plane and a plurality of word-lines B1, B2, and B3 to form an X-Z plane. The former example will be described in this specification, and the latter example may be applicable to the following description.

The word-lines W1 to W4 may be oriented in an X-axis direction, whereas the bit-lines B1 to B3 may be oriented in a Y-axis direction. The word-lines W1 to W4 intersect with the bit-lines B1 to B3, thereby forming a plurality of cross-points. A memory cell block 2 may be defined in each of these cross-points. The X-axis direction, the Y-axis direction, and the Z-axis direction may substantially lie at right angles to one another, and the Y-Z plane may substantially lie at right angles to the X-Z plane.

Each of the word-lines W1 to W4 may be configured in the form of comb. For instance, a first word-line W1 includes a plurality of word-lines W11, W12, W13, and W14 (hereinafter, referred to as local word-line) extending the Z-axis direction, and these local word-lines W11 to W14 may electrically be connected to one another by a first connection line W1 extending in the Y-axis direction. Accordingly, the first word-line W1 may be configured of the Y-Z plane. Similarly, a second word-line W2 includes a plurality of local word-lines W21, W22, W23, and W24 extending the Z-axis direction, and these local word-lines W21 to W24 may electrically be connected to one another by a second connection line W20 extending in the Y-axis direction. Accordingly, the second word-line W2 may be configured of the Y-Z plane. The above description may be applicable to a third word-line W3 and a fourth word-line W4. Even though four word-lines W1 to W4 are illustrated in this exemplary embodiment of the present inventive concept, the number of word-lines may be arbitrary. For example, the number of word-lines may be K. That is, the word-lines may be designated by WK (where, K is 1, 2, 3, and 4 in this exemplary embodiment).

A first bit-line B1 of the plurality of bit-lines B1, B2, and B3 includes a plurality of bit-lines B11, B12, B13, and B14 (hereinafter, referred to as local bit-line) extending the X-axis direction, and these local bit-lines B11 to B14 may be stacked in the Z-axis direction. A second bit-line B2 includes a plurality of local bit-lines B21, B22, B23, and B24 extending the X-axis direction, and these local bit-lines B21 to B24 may be oriented in the Z-axis direction. The above description may be applicable to a third bit-line B3. Even though three bit-lines B1 to B3 configured by four layers (that is, the number of local bit-lines) are illustrated in this exemplary embodiment of the present inventive concept, the number of bit-lines and the number of layers may be arbitrary. For example, the number of bit-lines may be M, and each of the bit-lines may be configured by N layers. That is, the bit-lines may be designated by BMN (where, M is 1, 2, and 3, and N is 1, 2, 3 and 4 in this exemplary embodiment).

The first bit-line B1 may be disposed so as to penetrate between the first local word-line W11 and the second local word-line W12 of the first word-line W1. Therefore, the first and second local word-lines W11 and W12 of the first word-line W1 intersect with the plurality of local bit-lines B11 to B14 of the first bit-line B1 at a right angle, and the memory cell block 2 may be defined in each of these cross-points. Similarly, the second and third local word-lines W12 and W13 of the first word-line W1 may intersect with the plurality of local bit-lines B21 to B24 of the second bit-line B2 at a right angle, and the third and fourth local word-lines W13 and W14 of the first word-line W1 may intersect with the plurality of local bit-lines B31 to B34 of the third bit-line B3 at a right angle. The cross-points between the first to third bit-lines B1 to B3 and the second to fourth word-lines W2 to W4 may be configured in a same manner as the cross-points between the first to third bit-lines B1 to B3 and the first word-line W1.

In the memory cell block 2, one local bit-line B11 may intersect with the first and second local word-lines W11 and W12. From a geometrical perspective, two memory cells C1 and C2 may be defined at both sides of the local bit-line B11, as illustrated in FIG. 2B. From a circuit perspective, however, two memory cells C1 and C2 may be regarded as one memory cell due to a simultaneously same operation. As a result, the number of memory cells may be the value that multiplies the number of bit-lines by the number of word-lines.

As an example, when K word-lines intersect with M bit-lines and when each of the M bit-lines is composed of N layers, the number of memory cells may be N×K×M. In a case of decoder for accessing the memory cells, the number of decoders required for accessing K word-lines may be K, and the number of decoders required for accessing M bit-lines composed of N layers, respectively, may be N×M. Accordingly, the total number of decoders may be K+(N×M). Following Table 1 is to compare structure characteristic of the resistance random access memory device 1 with that of the stack-shaped resistance random access memory device 10 described with reference to FIGS. 1A and 1B. Both memory devices 1 and 10 are stacked in N layers.

TABLE 1

|  | Resistance random access memory device 10 | Resistance random access memory device 1 |
| --- | --- | --- |
| Number of memory cells | N × K × M | N × K × M |
| Number of word-lines | N × K | K |
| Number of bit-lines | N × M | N × M |
| Number of decoders | (N × K) + (N × M) | K + (N × M) |
| Number of process steps | N × S | S |

Referring to Table 1, even though the resistance random access memory device is embodied by stacking in the same layers to define the same number of memory cell blocks, the number of word-lines of the resistance random access memory device 1 is reduced by 1/N compared to that of the resistance random access memory device 10. It will be understood that the number of decoders of the resistance random access memory device 1 is remarkably reduced compared to that of the resistance random access memory device 10. These differences may increase as the number N of stacks is large. Moreover, as will be described later with reference to FIGS. 8A to 8G, it will be also understood that the number of process steps required for defining the memory cell blocks arranged three-dimensionally in the resistance random access memory device according to the exemplary embodiment of the present inventive concept is reduced by 1/N compared to the related art.

As illustrated in FIG. 2B, the memory cells C1 and C2 may include a resistance element that stores information using variable property of resistance. Alternatively, as illustrated in FIG. 2C, the memory cells C1 and C2 may further include a selective element that can select the resistance element.

The resistance random access memory device 1 may be embodied as follows in various structures and ways.

First Device Example

Figure 3A:
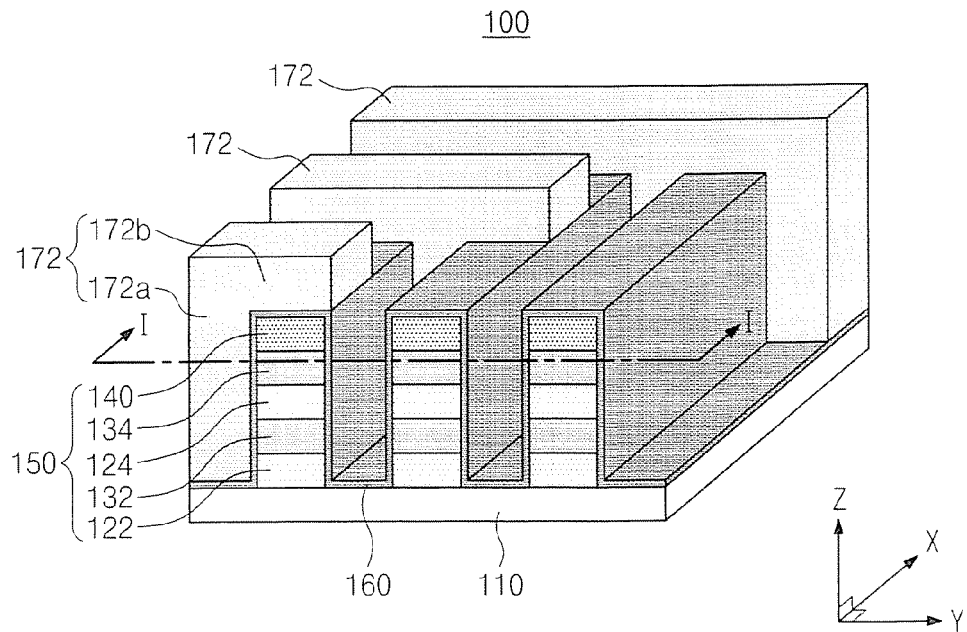
FIG. 3A is a perspective view illustrating a resistance random access memory device according to a first exemplary embodiment of the inventive concept.
Figure 3B:
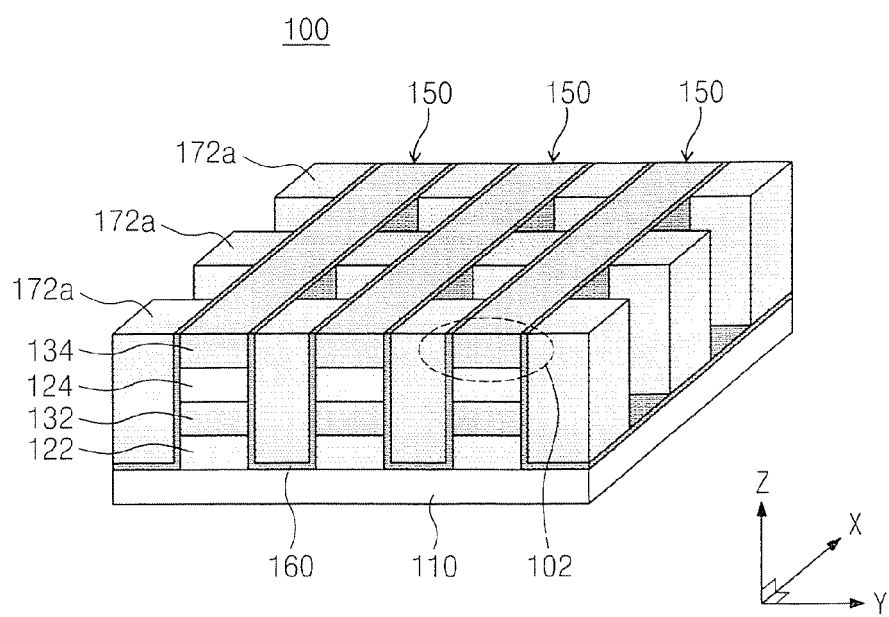
FIG. 3B is a perspective view including a section taken along a line I-I of FIG. 3A.
Figure 3C:
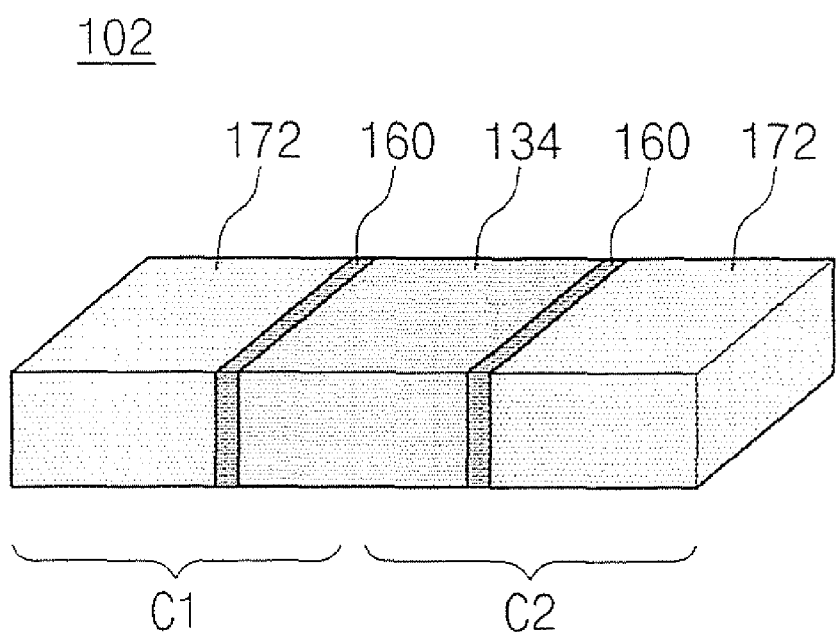
FIG. 3C is a perspective view illustrating a memory cell block of FIG. 3A.

FIG. 3A is a perspective view illustrating a resistance random access memory device according to a first exemplary embodiment of the present inventive concept; FIG. 3B is a perspective view including a section taken along a line I-I of FIG. 3A; and FIG. 3C is a perspective view illustrating a memory cell block.

Referring to FIG. 3A, a resistance random access memory device 100 may include a plurality of bit-line stacks 150 each having, a plurality of bit-lines on a substrate 110, a plurality of word-lines 172 that intersect with the plurality of bit-line stacks 150 at a substantially right angle, and resistance memory thin films 160 that are provided between the plurality of bit-line stacks 150 and the plurality of word-lines 172.

As another example, a resistance random access memory device may be formed by substituting word line stacks for the bit-line stacks 150 of FIG. 3A and substituting bit lines for the word lines 172 of FIG. 3A. Accordingly, an alternative resistance random access memory device may include a plurality of word-line stacks each having a plurality of word lines and a plurality of bit lines that intersect with the plurality of word-line stacks at a substantially right angle. In this alternative example, the resistance memory thin films are provided between the plurality of word-line stacks and the plurality of bit lines that intersect with each other. The former example of FIG. 3A will be described in this specification, and the latter example may be applicable to the following description.

Each of the bit-line stacks 150 may be formed by vertically stacking a plurality of conductive layers 132 and 134 extending in a horizontal direction. For instance, each of the bit-line stacks 150 may be formed by stacking the plurality of conductive layers 132 and 134 in a Z-axis direction. The plurality of conductive layers 132 and 134 may extend in an X-direction. The plurality of bit-line stacks 150 corresponds to the plurality of bit-lines B1 to B3 of FIG. 2A, and the plurality of conductive layers 132 and 134 corresponds to the plurality of local bit-lines B11 to B34 of FIG. 2A. The bit-line stack 150 may include a first insulating layer 122 and a second insulating layer 124. The first insulating layer 122 electrically insulates the first conductive layer 132 from the substrate 110, and the second insulating layer 124 electrically insulates the first insulating layer 132 from the second insulating layer 134. The bit-line stack 150 may further include a hard mask pattern 140 stacked on the second conductive layer 134, that is, the uppermost layer of the bit-line stack 150. In this specification, the conductive layers 132 and 134 may be used together with a term "local bit-line" for convenience.

Each of the word-lines 172 may include a plurality of conductive layers 172a and a conductive layer 172b. The conductive layers 172a may extend in a vertical direction from the side of the bit-line stack 150. The conductive layer 172b may extend in a horizontal direction across the bit-line stack 150. The plurality of conductive layers 172a may electrically be connected to one another through the conductive layer 172b. For example, each of the word-lines 172 may have a comb-shaped structure in which the plurality of conductive layers 172a extending in a Z-axis direction to fill the spaces between the bit-line stacks 150 are electrically connected to one another by one conductive layer 172b extending in a Y-axis direction.

The plurality of word-lines 172 corresponds to the plurality of word-lines W1 to W3 of FIG. 2A, the plurality of conductive layers 172a extending in the Z-axis direction corresponds to the plurality of local word-lines W11 to W44 of FIG. 2A, and the plurality of conductive layers 172b extending in the Y-axis direction corresponds to the plurality of connection lines W10 to W40 of FIG. 2A. In this specification, the conductive layer 172a may be used together with a term "local word-line" for convenience; and the conductive layer 172b may be used together with a term "connection line" for convenience.

The resistance memory thin film 160 may be provided so as to cover the substrate 110 including the bit-line stacks 150. For instance, the resistance memory thin film 160 may be a continuous plate along an extending direction (X-axis direction) of the bit-line stacks 150, a continuous plate along an extending direction (Z-axis direction) of the local word-line 172a, and a continuous plate along an extending direction (Y-axis direction) of the connection line 172b.

Referring to FIGS. 3A and 3B, the bit-line stacks 150 may be oriented in the Y-axis direction to form an X-Z plane, whereas the word-lines 172 may be oriented in the X-axis direction to form the Y-Z plane. The bit-line stacks 150 and the word-lines 172 may intersect with each other so that the plurality of local word-lines 172a stand oriented in the Y-axis direction to fill the spaces between the bit-line stacks 150. Therefore, the cross-points between the plurality of local bit-lines 132 and 134 and the plurality of local word-lines 172a are three-dimensionally arranged such that the memory cell block 102 is defined in each of the cross-points. In the memory cell block 102, the resistance memory thin film 160 may serve as an information storage layer that is a resistance element for storing information according to a variable property of resistance, while the local word-lines 172a and the local bit-lines 132 and 134 may serve as electrodes.

Referring to FIG. 3C, as described with reference to FIG. 2B, since the local word-lines 172 are disposed at right and left sides around any one local bit-line 134 from a geometrical perspective, two memory cells C1 and C2 may be defined in one memory cell block 102. From a circuit perspective, however, two memory cells C1 and C2 may be regarded as one memory cell due to a simultaneously same operation.

By applying a read voltage to the selective word-line and the selective bit-line, a read operation may be embodied with respect to the memory cell formed at the cross-point between the selective word-line and the selective bit-line. In the read operation, it can prevent current from flowing between the selective bit-line and the non-selective word-line by floating the non-selective word-line. A program operation may be embodied with respect to the memory cell formed at the cross-point between the word-line and the bit-line by putting to earth all of the word-lines and applying a program voltage to the selective bit-line. In a case of putting to earth all of the word-lines and applying the program voltage to all of the bit-lines, so called, a blanket program may be embodied with respect to the memory cells formed at the cross-point betweens the all of the word-lines and all of the bit-lines. This may usefully be used for embodying an erasing operation of a block unit.

Second Device Example

Figure 4A:
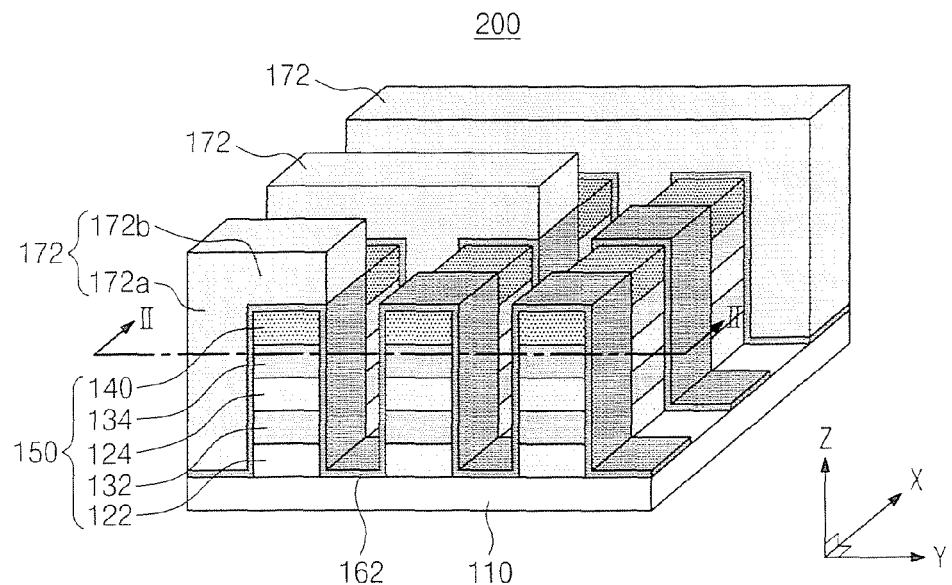
FIG. 4A is a perspective view illustrating a resistance random access memory device according to a second exemplary embodiment of the present inventive concept.
Figure 4B:
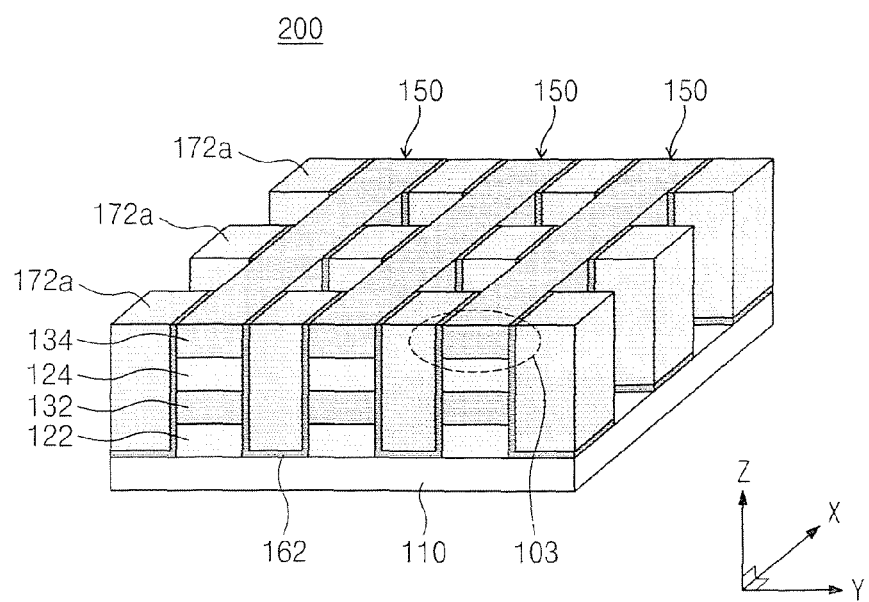
FIG. 4B is a perspective view including a section taken along a line II-II of FIG. 4A.

FIG. 4A is a perspective view illustrating a resistance random access memory device according to a second exemplary embodiment of the present inventive concept; and FIG. 4B is a perspective view including a section taken along a line II-II of FIG. 4A. The resistance random access memory device of the second exemplary embodiment of the inventive concept is equal and similar to that of the first exemplary embodiment of the inventive concept described with reference to FIGS. 3A to 3C. Accordingly, the same components will briefly be described or be omitted and different components will be described in detail.

Referring to FIGS. 4A and 4B, a resistance random access memory device 200 is similar to the resistance random access memory device 100 according to the first exemplary embodiment of the inventive concept described with reference to FIGS. 3A to 3C. That is, the resistance random access memory device 200 may have a 3D cross-point architecture in which the plurality of bit-line stacks 150 each having the plurality of local bit-lines 132 and 134 intersect with the plurality of comb-shaped word-lines 172 each having the plurality of local word-lines 172a at a substantially right angle on the substrate 110. A memory cell block 103, which is similar to that illustrate in FIG. 3C, may be defined in each of the cross-points.

A resistance memory thin film 162 may be provided between the bit-line stack 150 and the word-line 172. The resistance memory thin film 162 may be provided in the form of a strip. For instance, the resistance memory thin film 162 may be discontinuous along an extending direction (X-axis direction) of the bit-line stack 150, be continuous along an extending direction (Z-axis direction) of the local word-line 172a, and be continuous along an extending direction (Y-axis direction) of the connection line 172b. That is, each of the resistance memory thin films 162 may be a strip structure that is definitely disposed below each of the word-lines 172.

According to this exemplary embodiment of the inventive concept, when the program and/or erasing operations are performed with respect to the memory cells in the selective word-line 172, it can prevent the memory cells in the rest non-selective word-line 172 from being inadvertently programmed and/or erased. Accordingly, an error operation of the resistance random access memory device 200 may be minimized.

Third Device Example

Figure 5A:
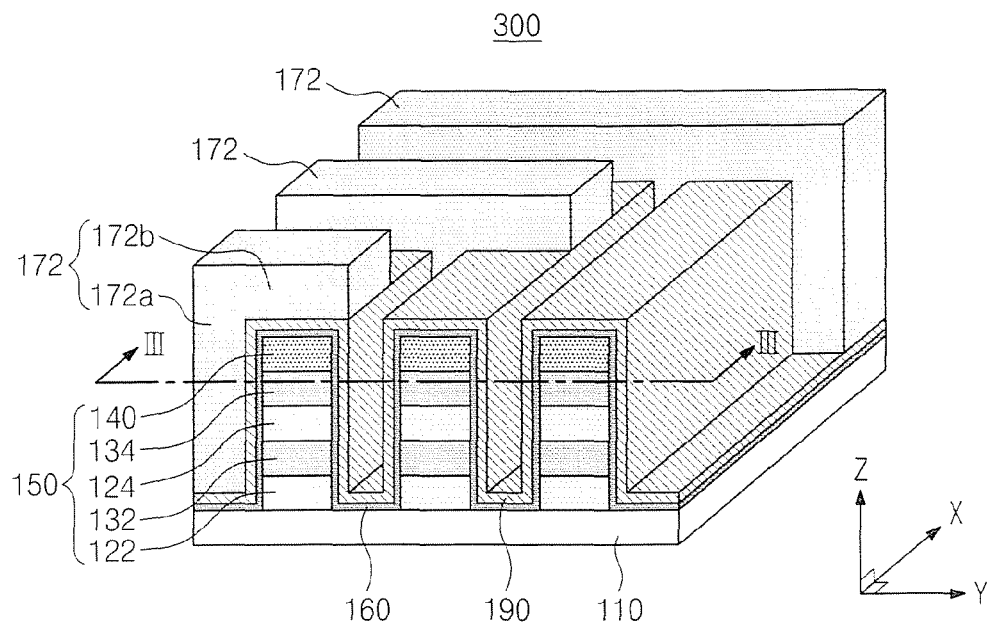
FIG. 5A is a perspective view illustrating a resistance random access memory device according to a third exemplary embodiment of the present inventive concept.
Figure 5B:
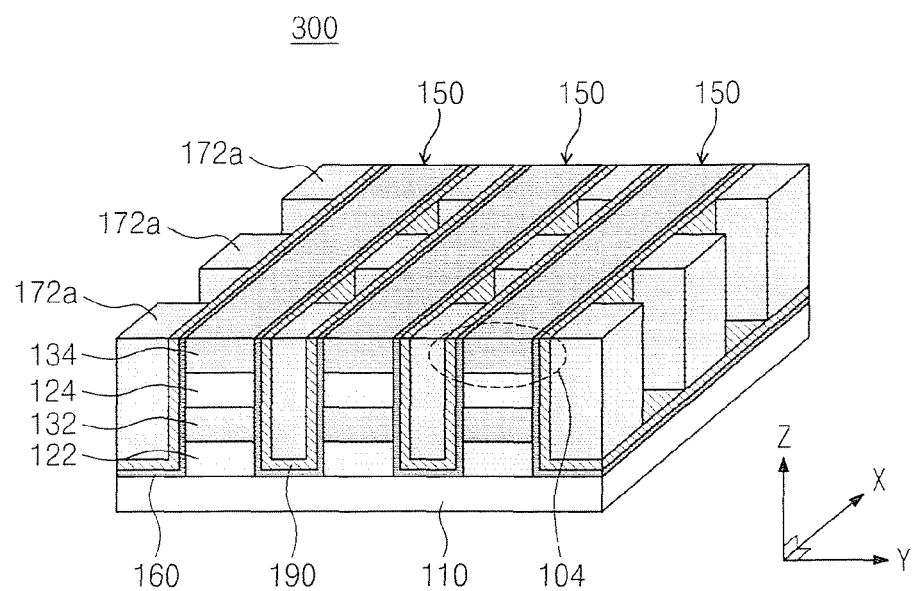
FIG. 5B is a perspective view including a section taken along a line of FIG. 5A.
Figure 5C:
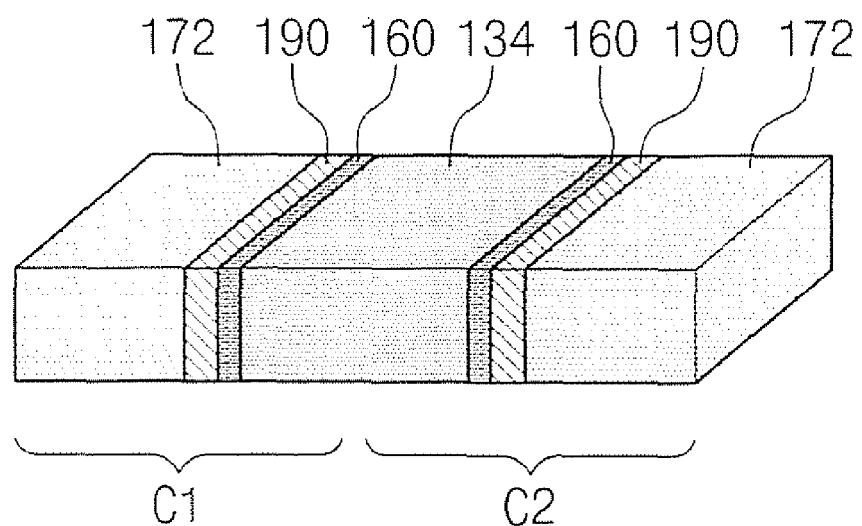
FIG. 5C is a perspective view illustrating a memory cell block of FIG. 5A.

FIG. 5A is a perspective view illustrating a resistance random access memory device according to a third exemplary embodiment of the present inventive concept; FIG. 5B is a perspective view including a section taken along a line of FIG. 5A; and FIG. 5C is a perspective view illustrating, a memory cell block. The resistance random access memory device of the third exemplary embodiment of the inventive concept is equal and similar to that of the first exemplary embodiment of the inventive concept described with reference to FIGS. 3A to 3C. Accordingly, the same components will briefly be described or be omitted and different components will be described in detail.

Referring to FIG. 5A, a resistance random access memory device 300 is similar to the resistance random access memory device 100 according to the first exemplary embodiment of the inventive concept described with reference to FIGS. 3A to 3C. That is, the resistance random access memory device 300 may have a 3D cross-point architecture in which the plurality of bit-line stacks 150 each having the plurality of local bit-lines 132 and 134 intersect with the plurality of comb-shaped word-lines 172 each having the plurality of local word-lines 172a at a substantially right angle on the substrate 110.

A resistance memory thin film 160 may be provided between the bit-line stack 150 and the word-line 172. The resistance memory thin film 160 may be provided in the form of a continuous plate. A switching thin film 190 may further be provided between the bit-line stack 150 and the word-line 172. For example, the switching thin film 190 may be provided between the resistance memory thin film 160 and the word-line 172 in the form of a continuous plate.

Figure 14A:
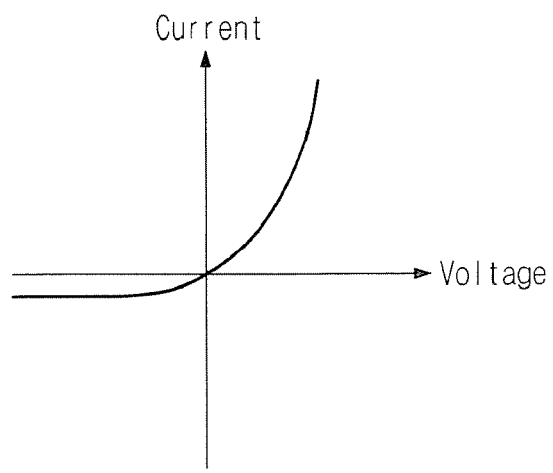
FIGS. 14A and 14B are views illustrating current-voltage curve of a switching thin film according to a first exemplary embodiment of the present inventive concept.
Figure 14B:
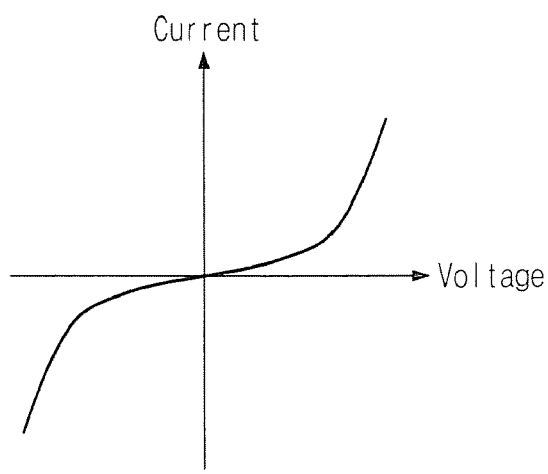

The switching thin film 190 may serve as a switching element or a selective element for switching or selecting the resistance memory thin film 160. The switching thin film 190 has a current-voltage characteristic as illustrated in FIG. 14A and may be an element that can make a current flow in one direction. For instance, the switching thin film 190 may be a diode or varistor (variable resistor) that can make the current flow when an applied voltage is more than a specific value but can not make the current flow when the applied voltage is less than a specific value. As another example, the switching thin film 190 may be an element having a current-voltage characteristic as illustrated in FIG. 14B. For instance, the switching thin film 190 may be a threshold switching element that can not make the current flow when an applied voltage is within the range of a specific value but can make the current flow when the applied voltage is more or less than a specific value.

Alternatively, when the resistance random access memory device 300 includes the plurality of word-line stacks 150 and the plurality of bit-lines 172 with the resistance memory thin film 160 therebetween, the switching thin film 190 may be provided between the word-line stack 150 and the resistance memory thin film 160.

Referring to FIGS. 5A and 5B, the plurality of word-lines 172 intersect with the bit-line stacks 150 at a substantially right angle such that the plurality of local word-lines 172a fill the spaces between the bit-line stacks 150. Therefore, the cross-points between the plurality of local bit-lines 132 and 134 and the plurality of local word-lines 172a are three-dimensionally arranged such that the memory cell block 104 is defined in each of the cross-points. In the memory cell block 104, the local word-line 172a and the local bit-lines 132 and 134 may serve as electrodes, the resistance memory thin film 160 may serve as an information storage layer that is a resistance element for storing information according to a variable property of resistance, and the switching thin film 190 may serve as a selective element for selecting the resistance element.

Referring to FIG. 5C, from a geometrical perspective, two memory cells C1 and C2 may be defined in one memory cell block 104. From a circuit perspective, however, two memory cells C1 and C2 may be regarded as one memory cell due to a simultaneously same operation.

Fourth Device Example

Figure 6A:
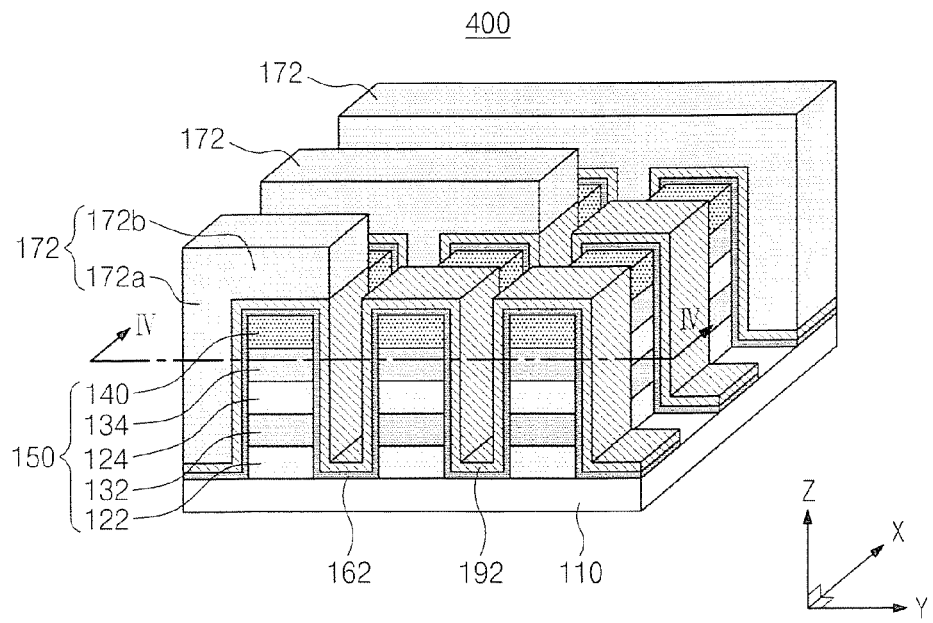
FIG. 6A is a perspective view illustrating a resistance random access memory device according to a fourth exemplary embodiment of the present inventive concept.
Figure 6B:
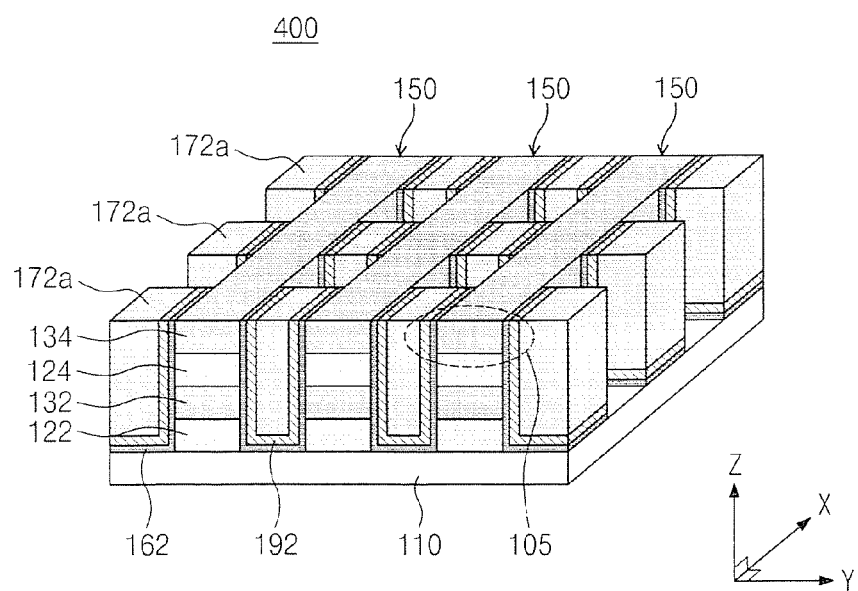
FIG. 6B is a perspective view including a section taken along a line IV-IV of FIG. 6A.

FIG. 6A is a perspective view illustrating a resistance random access memory device according to a fourth exemplary embodiment of the present inventive concept; and FIG. 6B is a perspective view including a section taken along a line IV-IV of FIG. 6A. The resistance random access memory device of the fourth exemplary embodiment of the inventive concept is equal and similar to that of the first exemplary embodiment of the inventive concept described with reference to FIGS. 3A to 3C. Accordingly, the same components will briefly be described or be omitted and different components will be described in detail.

Referring to FIG. 6A, a resistance random access memory device 400 is similar to the resistance random access memory device 100 according to the first exemplary embodiment of the inventive concept described with reference to FIGS. 3A to 3C. That is, the resistance random access memory device 400 may have a 3D cross-point architecture in which the plurality of bit-line stacks 150 each having the plurality of local bit-lines 132 and 134 intersect with the plurality of comb-shaped word-lines 172 each having the plurality of local word-lines 172a at a substantially right angle on the substrate 110.

A resistance memory thin film 162 may be provided between the bit-line stack 150 and the word-line 172. The resistance memory thin film 162 may be provided in the form of a strip disposed definitely below the word-line 172. A switching thin film 192 may further be provided between the bit-line stack 150 and the word-line 172. For example, the switching thin film 192 may be provided between the resistance memory thin film 162 and the word-line 172 in the form of a strip.

Referring to FIGS. 6A and 6B, the plurality of word-lines 172 intersect with the bit-line stacks 150 at a substantially right angle such that the plurality of local word-lines 172a fill the spaces between the bit-line stacks 150. Therefore, the cross-points between the plurality of local bit-lines 132 and 134 and the plurality of local word-lines 172a are three-dimensionally arranged such that the memory cell block 105, which is similar to that illustrate in FIG. 5C, is defined in each of the cross-points.

Fifth Device Example

Figure 7A:
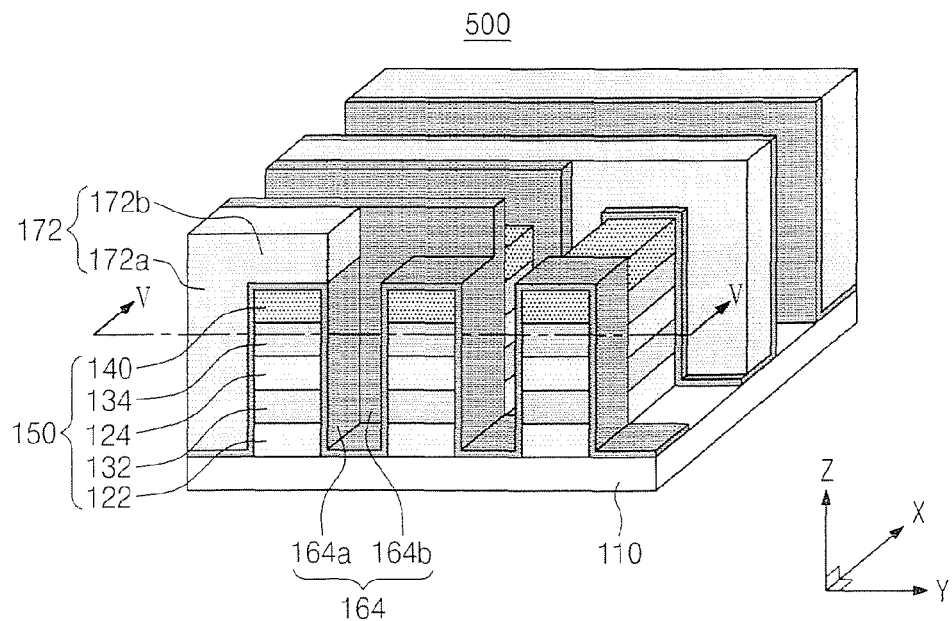
FIG. 7A is a perspective view illustrating a resistance random access memory device according to a fifth exemplary embodiment of the present inventive concept.
Figure 7B:
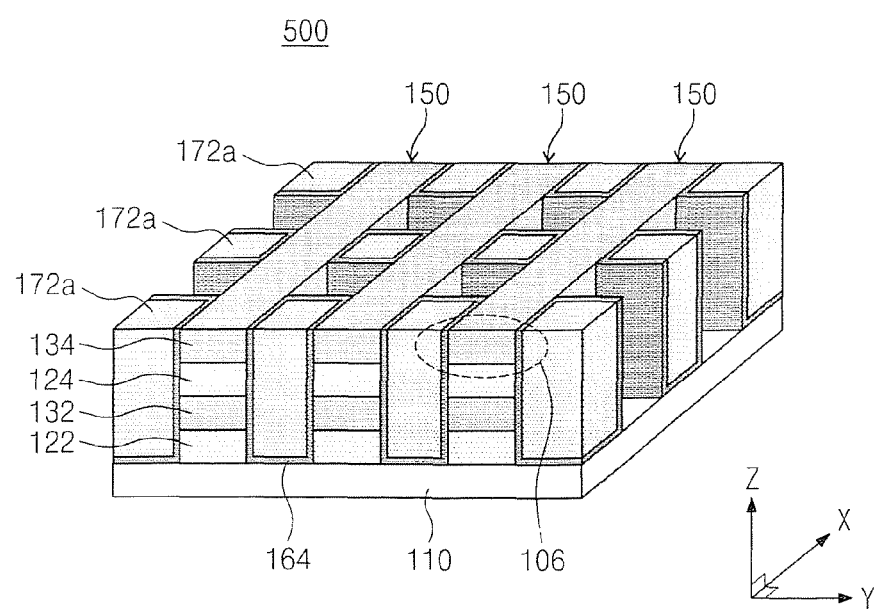
FIG. 7B is a perspective view including a section taken along a line V-V of FIG. 7A.

FIG. 7A is a perspective view illustrating a resistance random access memory device according to a fifth exemplary embodiment of the present inventive concept; and FIG. 7B is a perspective view including a section taken along a line V-V of FIG. 7A. The resistance random access memory device of the fifth exemplary embodiment of the inventive concept is equal and similar to that of the first exemplary embodiment of the inventive concept described with reference to FIGS. 3A to 3C. Accordingly, the same components will briefly be described or be omitted and different components will be described in detail.

Referring to FIG. 7A, the resistance random access memory device 500 is similar to the resistance random access memory device 100 according to the first exemplary embodiment of the inventive concept described with reference to FIGS. 3A to 3C. That is, the resistance random access memory device 500 may have a 3D cross-point architecture in which the plurality of bit-line stacks 150 each having the plurality of local bit-lines 132 and 134 intersect with the plurality of comb-shaped word-lines 172 each having the plurality of local word-lines 172a at a substantially right angle on the substrate 110.

A resistance memory thin film 164 may be provided between the bit-line stack 150 and the word-line 172. The resistance memory thin film 164 may include a first layer 164a disposed definitely below the word-line 172 and a second layer 164b covering, a side of the word-line 172. The first layer 164a may be strip-shaped covering the bit line stack 150 below the word-line 172. The second layer 164b may be vertical plate-shaped covering a side of the local word-line 172a and a side of the connection line 172b. That is, a resistance memory thin film 164 may further be disposed at the side surface of the word-line 172. Therefore, the resistance memory thin film 164 may surround circumferences of the local word-lines 172a, as illustrated in FIG. 7B. A switching thin film may further be provided between the resistance memory thin film 164 and the word-line 172.

Referring, to FIGS. 7A and 7B, the plurality of word-lines 172 intersect with the bit-line stacks 150 at a substantially right angle such that the plurality of local word-lines 172a fill the spaces between the bit-line stacks 150. Therefore, the cross-points between the plurality of local bit-lines 132 and 134 and the plurality of local word-lines 172a are three-dimensionally arranged such that the memory cell block 106, which is similar to that illustrate in FIG. 3C, is defined in each of the cross-points.

First Fabrication Example

FIGS. 8A to 8G are sectional views illustrating a method of fabricating a resistance random access memory device according to a first exemplary embodiment of the present inventive concept.

Figure 8A:
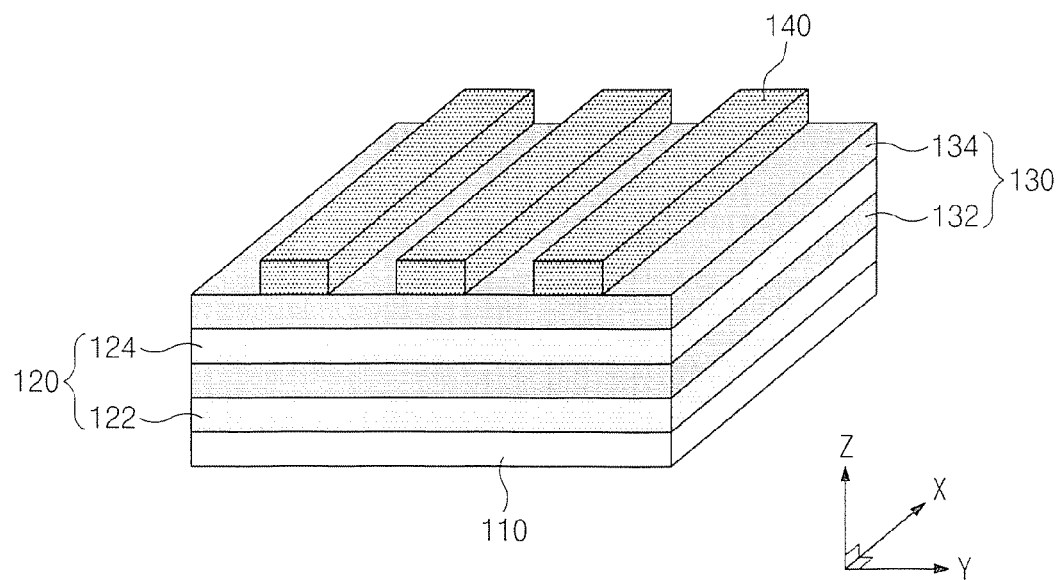
FIGS. 8A to 8G are sectional views illustrating a method of fabricating a resistance random access memory device according to a first exemplary embodiment of the present inventive concept.

Referring to FIG. 8A, a stacked body may be formed on the substrate 110. The stacked body includes an insulating layer group 120 provided with a plurality of insulating layers 122 and 124 and a conductive layer group 130 provided with a plurality of conductive layers 132 and 134. As an example, a first insulating layer 122, a first conductive layer 132, a second insulating layer 124, and a second conductive layer 134 are sequentially formed on the substrate 110 such as a silicon wafer. Selectively, at least one insulating layer and at least one conductive layer may alternatively be stacked on the second conductive layer 134. The insulating layer group 120 may be formed by depositing an insulating thin film. For instance, the insulating layer group 120 may be formed by depositing a silicon oxide (e.g., $SiO_2$) or a silicon nitride (e.g., SiN, $Si_3N_4$, or SiON). The conductive layer group 130 may be formed by depositing or growing a conductive thin film such as a metal or a conductive oxide layer. For instance, the conductive layer group 130 may be formed by depositing or growing YBCO (e.g., $YBa_2Cu_3O_7$), Pt, Ir, Cu, Ag, Au, or impurity-doped poly silicon.

A hard mask pattern 140 may be formed on the conductive layer group 130 to serve as a mask in an etching process (bit-line etching process) for defining the bit-lines. For instance, the hard mask pattern 140 may be provided so as to extend in the X-axis direction on the second conductive layer 134. The hard mask pattern 140 may not be removed after the bit-line etching process but be utilized as a hard mask in a subsequent etching process for forming the word-lines (word-line etching process). The hard mask pattern 140 may be formed by depositing a titanium nitride (e.g., TiN), a silicon nitride (e.g., SiN, $Si_3N_4$, or SiON), or a silicon oxide (e.g., $SiO_2$).

Figure 8B:
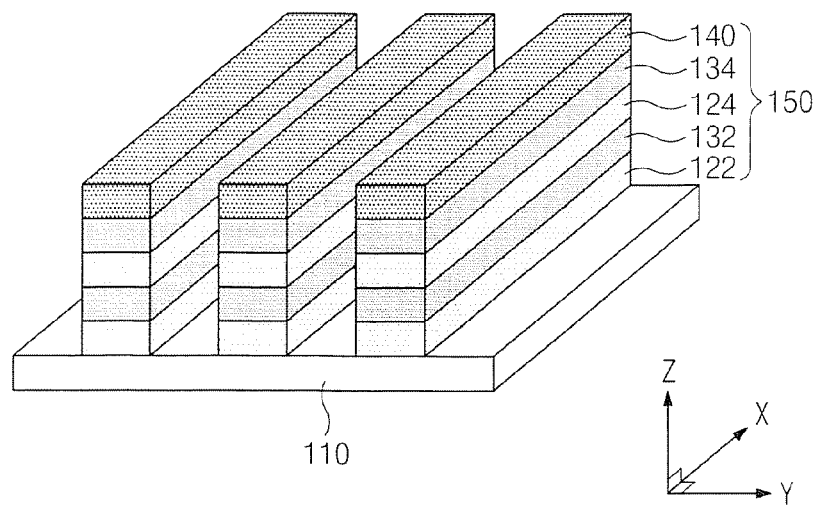

Referring to FIG. 8B, the conductive layer group 130 and the insulating layer group 120 may continuously be patterned by the bit-line etching process utilizing the hard mask pattern 140 as a mask, resulting in forming a plurality of bit-line stacks 150. According to this exemplary embodiment of the inventive concept, the bit-line etching process may adopt a reactive ion etching (RIE) process.

The bit-line stack 150 includes the first insulating layer 122, the first conductive layer 132, the second insulating layer 124, and the second conductive layer 134, which are sequentially stacked, and may be provided in the form of a barrier or wall extending in the X-axis direction. The hard mask pattern 140 may further be provided in the bit-line stack 150.

The first insulating layer 122, the first conductive layer 132, the second insulating layer 124, and the second conductive layer 134 may be self-aligned by the bit-line etching process.

The first and second conductive layers 132 and 134, which are patterned, correspond to the bit-lines, that is, the local bit-lines B11 to B34 extending in the X-axis direction of FIG. 2A. In addition, the plurality of bit-line stacks 150 correspond to the plurality of bit-lines B1 to B3 forming the X-Z plane in FIG. 2A. According to this exemplary embodiment of the inventive concept, as illustrated in FIG. 2A, all of the bit-lines B1 to B3 may be formed by a single bit-line etching process.

Figure 8C:
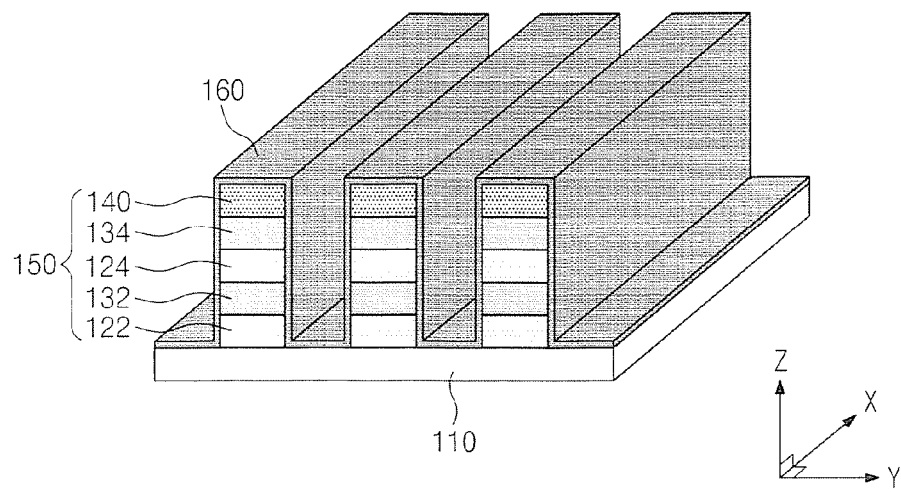

Referring to FIG. 8C, a resistance memory thin film 160 may be formed by depositing resistive memory materials. The resistance memory thin film 160 may be formed by a deposition process suitable for depositing a thin film. For instance, the resistance memory thin film 160 may be formed by a chemical vapor deposition process to cover the bit-line stacks 150 with a relatively uniform thickness.

The resistive memory materials, which form the resistance memory thin film 160, may include materials having bi-stable resistive states in which the resistance can reversibly be varied by the applied voltage. For example, the resistive memory materials may include colossal magnetoresistance materials, high temperature superconductivity materials, metal oxides, or chalcogenides. The metal oxides may, for example, include Ni-, Ti-, Zr-, Hf-, Co-, Fe-, Cu-, Al-, Nb-, Mg-, V-, and Cr-oxide or the combination thereof.

Figure 8D:
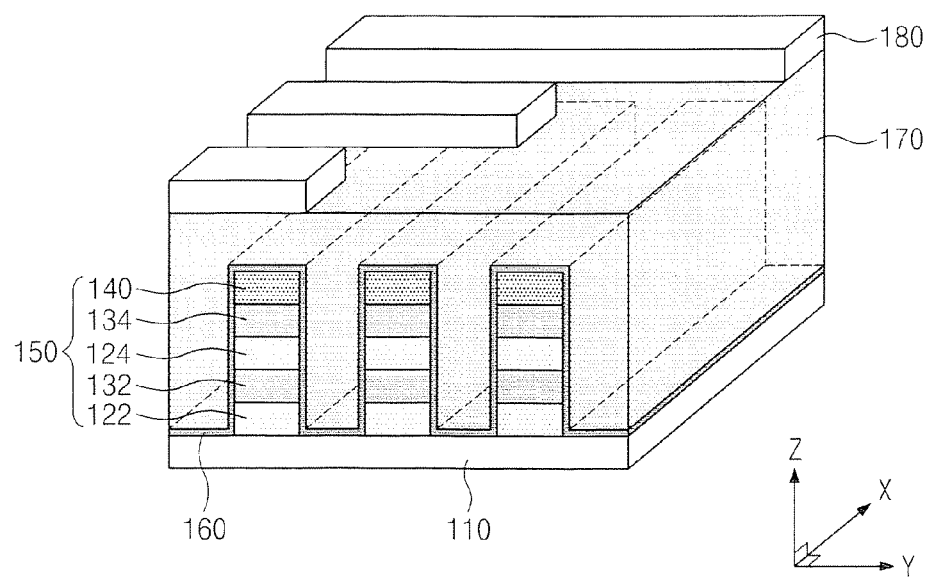

Referring to FIG. 8D, a conductive layer 170 may be formed by depositing conductive materials on the overall substrate 110. The conductive layer 170 may be formed by depositing or growing materials that are equal or similar to those of the conductive layer group 130. For example, the conductive layer 170 may be formed of YBCO. Pt, Ir, Cu, Ag, Au, or impurity-doped poly silicon. A mask pattern 150 may be formed on the conductive layer 170 to serve as a mask in an etching process (word-line etching process) for defining the word-lines. After a photoresist is provided on the conductive layer 170, the mask pattern 150 may then be formed by patterning the photoresist. The mask pattern 180 may be provided in the form of plural lines extending in the Y-axis direction. Some of several mask patterns 180 is partially illustrated in FIG. 8D for convenience of description.

Figure 8E:
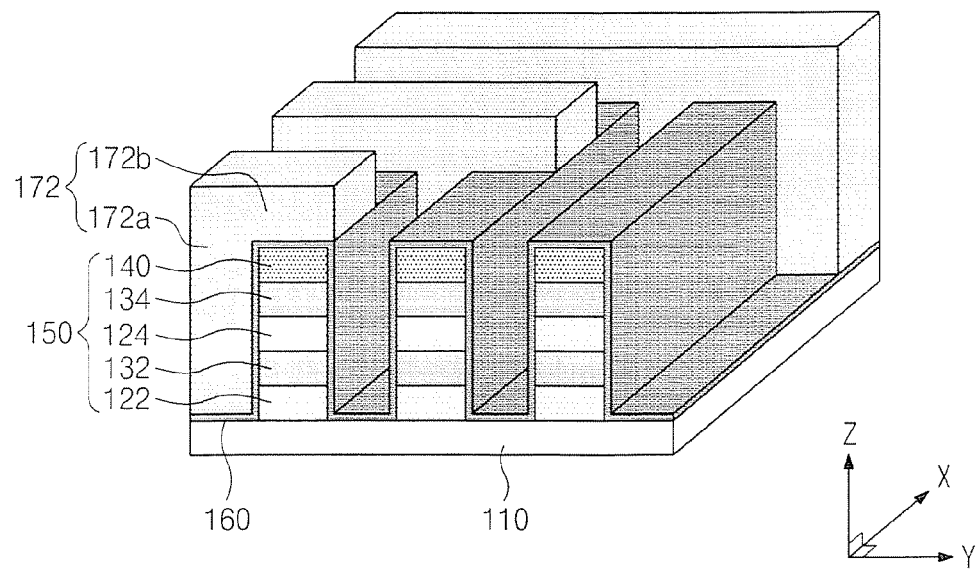

Referring to FIG. 8E, the conductive layer 170 may selectively be removed by the word-line etching process. A plurality of word-lines 172 may be formed by the word-line etching process. The resistance memory thin film 160 may not be removed during the word-line etching process. The word-line etching process may adopt a reactive ion etching (RIE) process.

The word-line 172 may be provided in the form of a comb to form the Y-Z plane. For instance, the word-line 172 may include a plurality of local word-lines 172a and a connection line 172b. The plurality of local word-lines 172a fill the spaces between the bit-line stacks 150 and extend in the Z-axis direction, while the connection line 172b extends in the Y-axis direction to connect electrically the plurality of local word-lines 172a with one another.

The plurality of word-lines 172 correspond to the plurality of word-lines W1 to W3 in FIG. 2A. In case of comparing one of the word-lines 172 with the first word-line W1 of FIG. 2A, the plurality of local word-lines 172a correspond to the local word-lines W11 to W14 of FIG. 2A, and the connection line 172b corresponds to the first connection line W10 of FIG. 2A. According to this exemplary embodiment of the inventive concept, the plurality of word-lines 172, that is, all of the word-lines W1 to W3 of FIG. 2A, may be formed by a single word-line etching process.

Figure 8F:
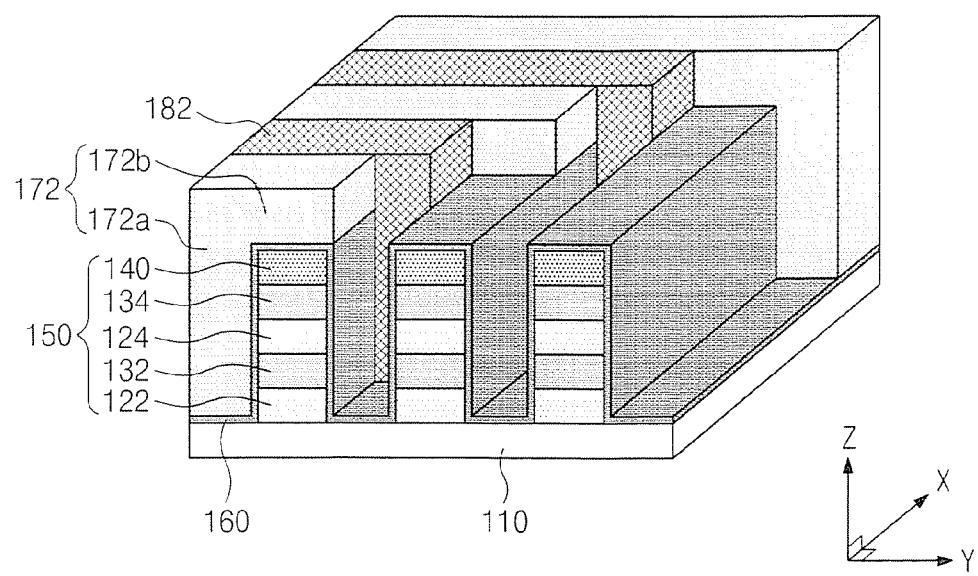
Figure 8G:
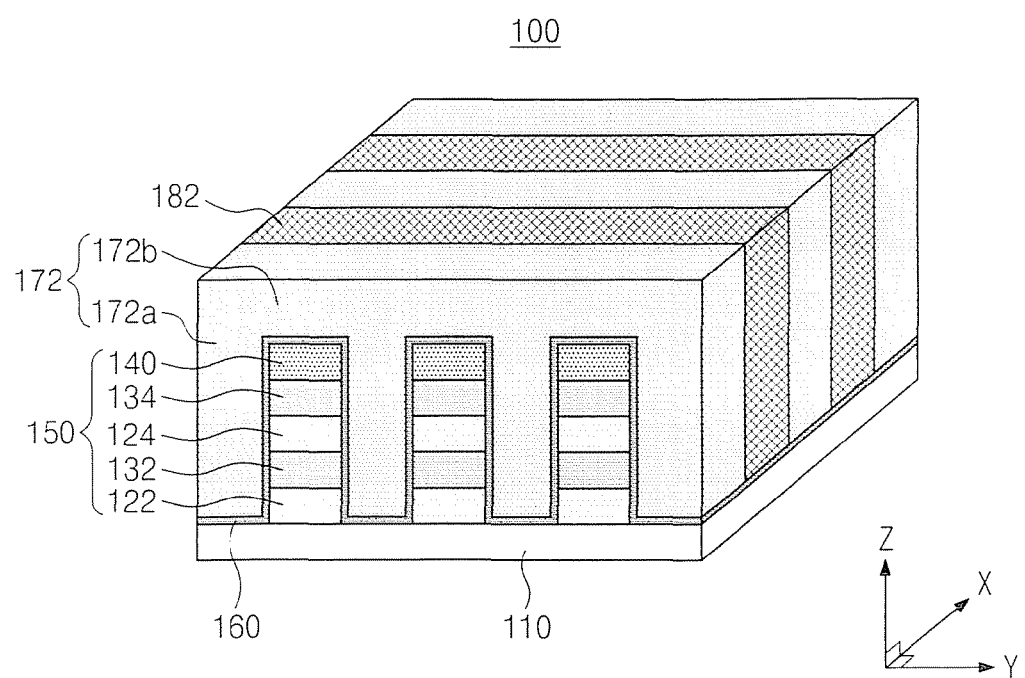

Referring to FIGS. 8F and 8G, an insulating layer 182 may be formed between the word-lines 172 by depositing an insulating material. This may embody the resistance random access memory device 100 including the plate-shaped resistance memory thin film 160 as illustrated in FIG. 3A. The insulating layer 182 may be formed by depositing a silicon nitride (e.g., SiN, $Si_3N_4$, or SiON), or, preferably, a silicon oxide (e.g., $SiO_2$) having a good insulating property. Some of the word-lines 172 and the insulating layers 182 are partially illustrated in FIG. 8F for convenience of description.

According to this exemplary embodiment of the inventive concept, all of the bit-lines (B1 to B3 of FIG. 2A) may be formed by a single bit-line etching process as described with reference to FIG. 8B, and all of the word-lines (W1 to W3 of FIG. 2A) may be formed by a single word-line etching process as described with reference to FIG. SE. Accordingly, even though the number of stacked bit-lines becomes more and more large, the number of process steps may be reduced by a single bit-line etching process compared to the conventional art.

Figure 1B:
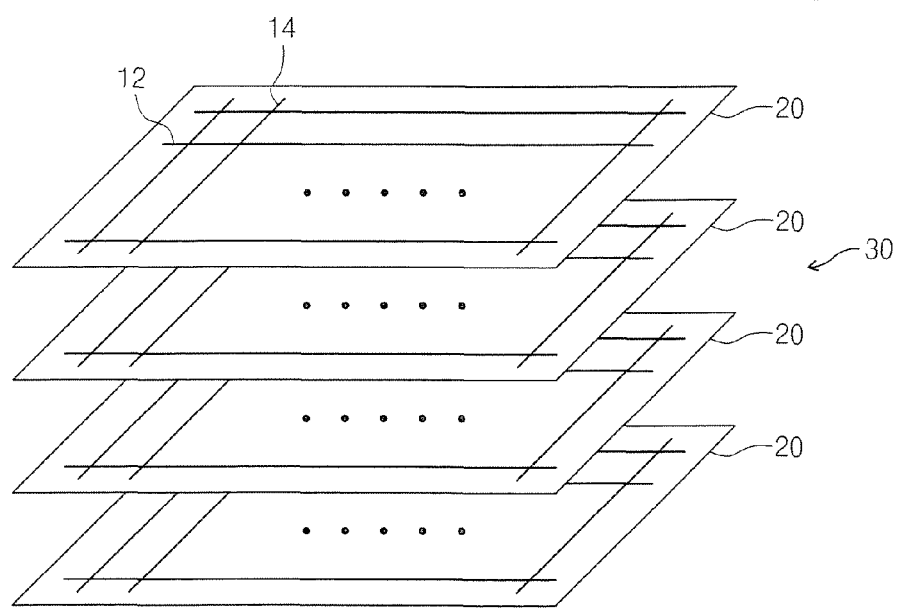
FIG. 1B is a circuit diagram illustrating schematically a memory array of a stack-shaped resistance random access memory device according to a conventional art.

For example, assuming that the number of process steps required for forming memory layers is referred to as S and the number of stacks is referred to as N, the number of process steps required for forming the resistance random access memory device 10 according to the conventional art illustrated in FIG. 1B is S×N, but the number of process steps required for forming the resistance random access memory device 100 according, to the this exemplary embodiment of the inventive concept is S. That is, according to the fabricating method of this exemplary embodiment of the inventive concept, the stacked memory layers may be formed with the number of process steps required for forming one memory layer.

Second Fabrication Example

FIGS. 9A to 9D are sectional views illustrating a method of fabricating, a resistance random access memory device according to a second exemplary embodiment of the present inventive concept. The fabricating method of the second exemplary embodiment of the inventive concept is equal and similar to that of the first exemplary embodiment of the inventive concept described with reference to FIGS. 8A to 8G. Accordingly, the same processes will briefly be described or be omitted and different processes will be described in detail.

Figure 9A:
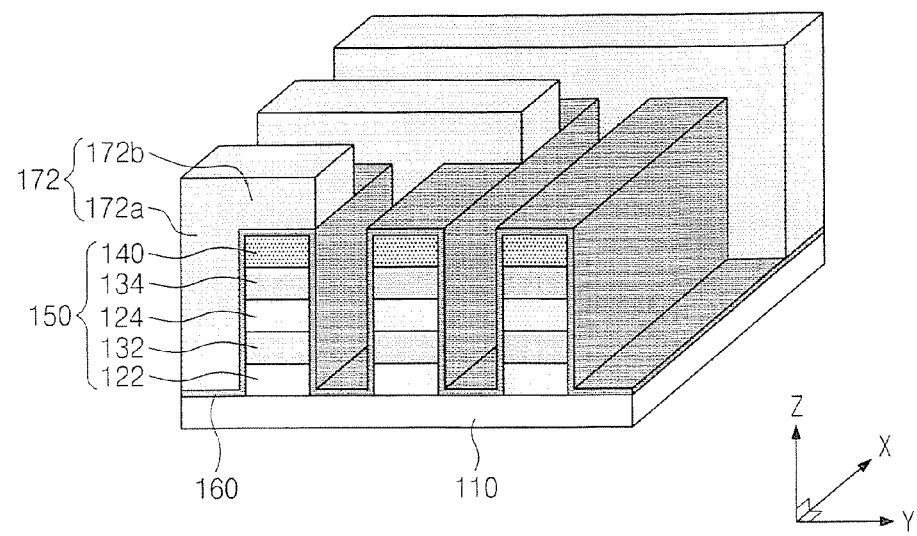
FIGS. 9A to 9D are sectional views illustrating a method of fabricating a resistance random access memory device according to a second exemplary embodiment of the present inventive concept.

Referring to FIG. 9A, the plurality of bit-line stacks 150, the resistance memory thin film 160, and the plurality of word-lines 172 may be formed in the same or similar processes as described with reference to FIGS. 8A to 8E. That is, the plurality of bit-line stacks 150 are formed on the substrate 110, the resistance memory thin film 160 is formed to cover the plurality of bit-line stacks 150, and the plurality of word-lines 172 are formed on the resistance memory thin film 160.

In the same or similar manner as described with reference to FIGS. 8A and 8B, the plurality of bit-line stacks 150 may be formed through the bit-line etching process, after sequentially depositing the plurality of conductive layers 132 and 134, the plurality of insulating layers 122 and 124, and the hard mask pattern 140. The bit-line stacks 150 may be formed so as to extend in the X-axis direction.

The resistance memory thin film 160 may be formed in the same or similar manner as described with reference to FIG. 8D, for example, by depositing materials in which the resistance is reversibly variable depending on the applied voltage. The resistance memory thin film 160 may be provided in the form of a plate that covers the bit-line stack 150 conformally.

In the same or similar manner as described with reference to FIGS. 8D and 8E, after a metallic or conductive material is deposited on the resistance memory thin film 160, the plurality of word-lines 172 may be formed by patterning the deposited material through the word-line etching process. The word-lines 172 may be provided in the form of a comb such that the plurality of local word-lines 172a extending in the Z-axis direction are electrically connected to one another by one connection line 172b extending in the Y-axis direction.

Figure 9B:
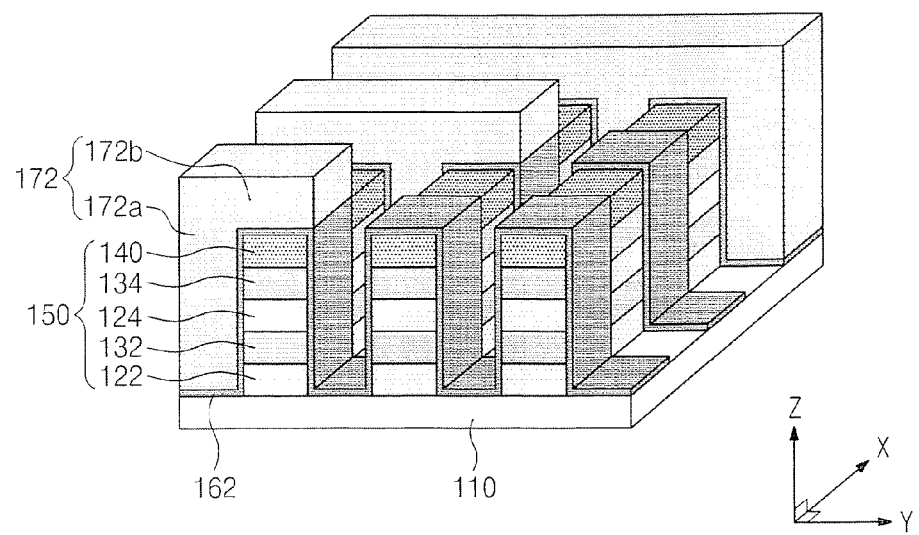

Referring to FIG. 9B, portions of the resistance memory thin film 160 exposed between the word-lines 172 may further be removed. This removal process may be a dry etching process, for example, a reactive ion etching process. This allows the plate-shaped resistance memory thin film 160 to be embodied as a strip-shaped resistance memory thin film 162 disposed definitely below the word-line 172. During a selective etching process for forming the strip-shaped resistance memory thin film 162, the bit-line stack 150 may be exposed, but the second conductive layer 134 may be protected by the hard mask pattern 140.

Figure 9C:
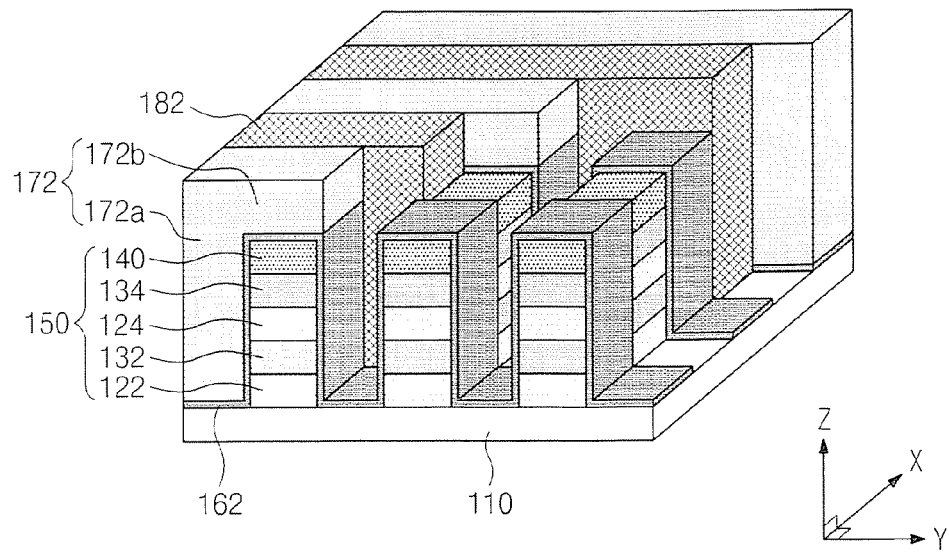
Figure 9D:
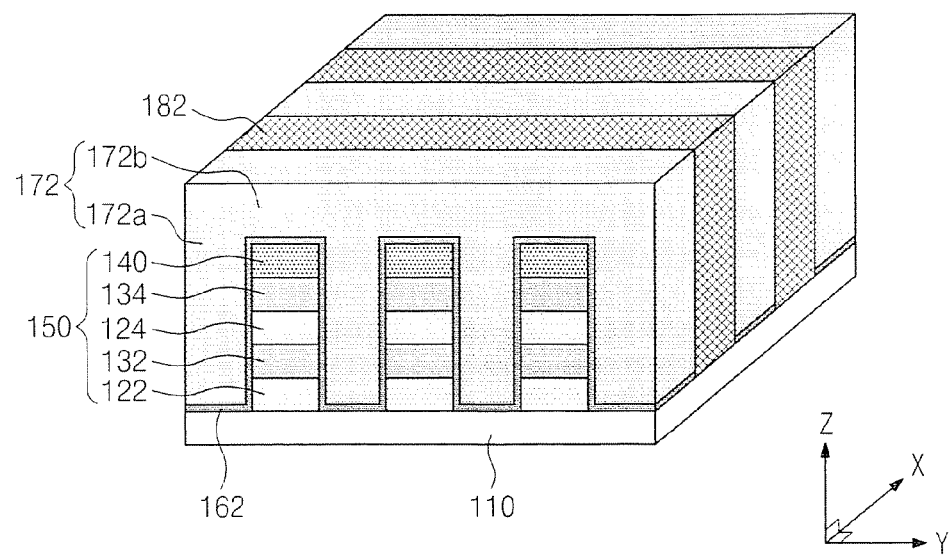

Referring to FIGS. 9C and 9D, the insulating layer 182 may be formed in the same or similar process as described with reference to FIGS. 8F and 8G, for example, by depositing an insulating material between the word-lines 172. As a result, it may realize the resistance random access memory device 200 including the strip-shaped resistance memory thin film 162 as illustrated in FIG. 4A.

Third Fabrication Example

FIGS. 10A to 10D are sectional views illustrating a method of fabricating a resistance random access memory device according to a third exemplary embodiment of the present inventive concept. The fabricating method of the third exemplary embodiment of the inventive concept is equal and similar to that of the first exemplary embodiment of the inventive concept described with reference to FIGS. 8A to 8G. Accordingly, the same processes will briefly be described or be omitted and different processes will be described in detail.

Figure 10A:
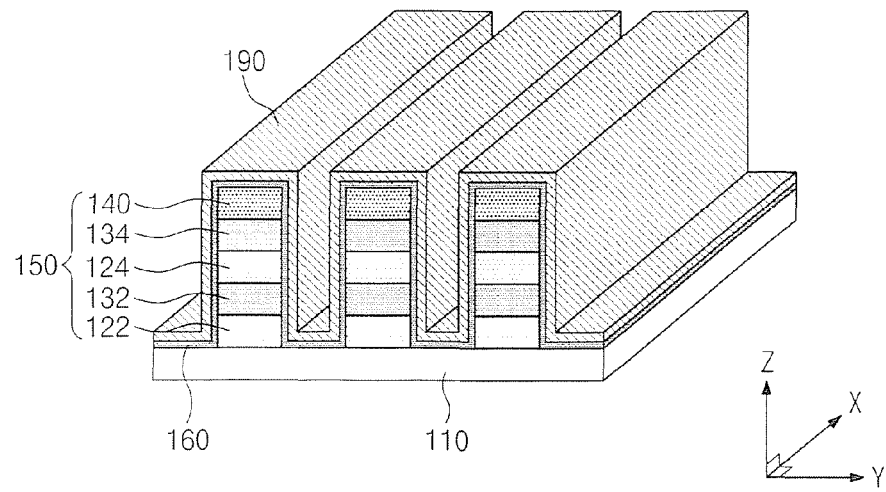
FIGS. 10A to 10D are sectional views illustrating a method of fabricating a resistance random access memory device according to a third exemplary embodiment of the present inventive concept.

Referring to FIG. 10A, the plurality of bit-line stacks 150 and the resistance memory thin film 160 may be formed in the same or similar process as described with reference to FIGS. 8A to 8E. That is, the plurality of bit-line stacks 150 are formed on the substrate 110, and the resistance memory thin film 160 is formed to cover the plurality of bit-line stacks 150. Moreover, the switching thin film 190 may be formed to cover the resistance memory thin film 160. The resistance memory thin film 160 may be provided in the form of a plate in the same or similar manner as described with reference to FIG. 8C.

The switching thin film 190 may serve as an element for switching or selecting the resistance memory thin film 160. The switching thin film 190 may be formed of materials that can make a current flow in one direction, for example, materials that can make the current flow when an applied voltage is more than a specific value but can not make the current flow when the applied voltage is less than a specific value, as illustrated in FIG. 14A. That is, the switching thin film 190 may be formed of materials, which can utilize as a metal oxide varistor, for example, ZnO, $SrTiO_3$, or $BaTiO_3$. As another example, the switching thin film 190 may be formed of materials that can not make the current flow when an applied voltage is within the range of a specific value but can make the current flow when the applied voltage is more or less than a specific value, as illustrated in FIG. 14B. The switching thin film 190 may be formed of tunneling insulating materials or chalcogenides to serve as a threshold switching element. The switching thin film 190 may be provided in the form of a plate to uniformly cover the resistance memory thin film 160.

Figure 10B:
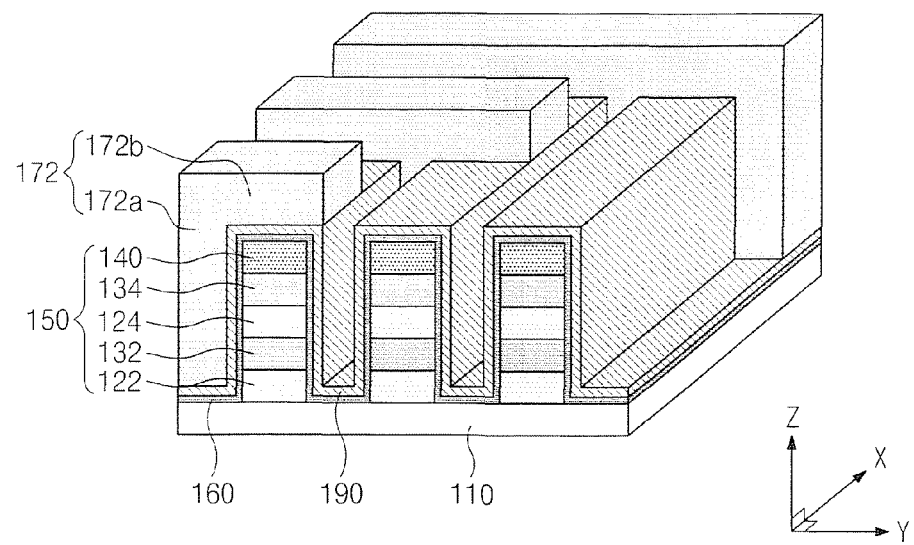

Referring to FIG. 10B, the plurality of word-lines 172 may be formed on the switching thin film 190 in the same or similar process as described with reference to FIGS. 8D and 8E. In the same or similar manner as described with reference to FIGS. 8D and 8E, after a metallic or conductive material is deposited on the switching thin film 190, the plurality of word-lines 172 may be formed by patterning the deposited material through the word-line etching process. The word-lines 172 may be provided in the form of a comb such that the plurality of local word-lines 172a extending in the Z-axis direction are electrically connected to one another by one connection line 172b extending in the Y-axis direction.

Figure 10C:
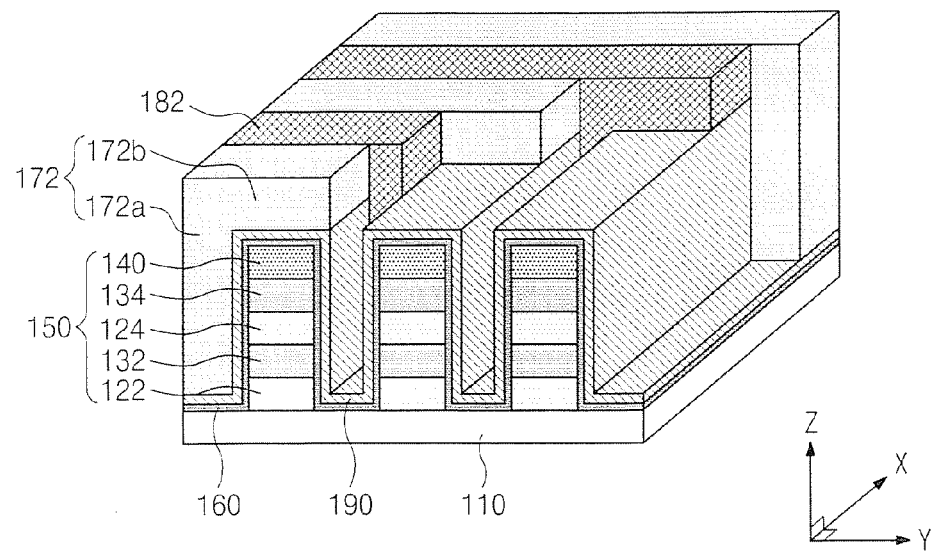
Figure 10D:
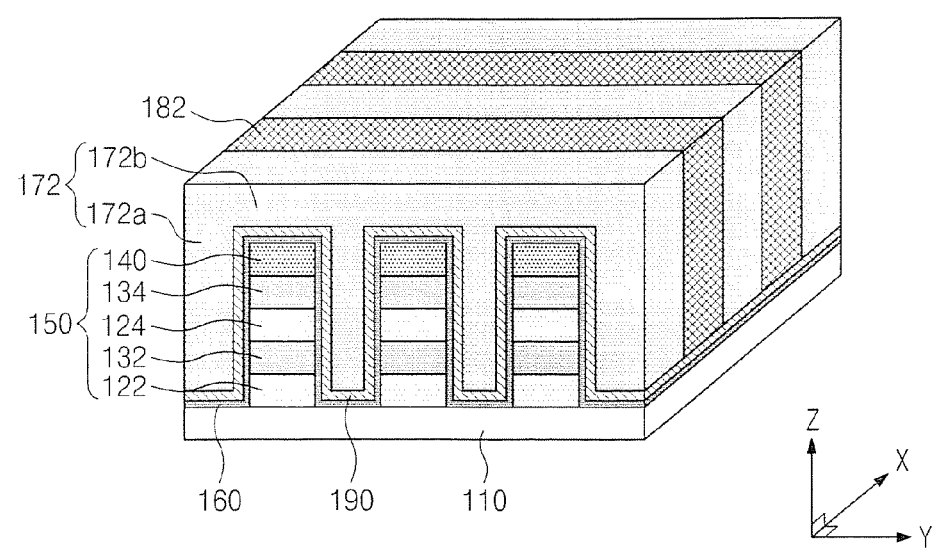

Referring to FIGS. 10C and 10D, the insulating layer 182 may be formed in the same or similar process as described with reference to FIGS. 8F and 8G, for example, by depositing an insulating material between the word-lines 172. As a result, it may realize the resistance random access memory device 300 including the plate-shaped resistance memory thin film 160 and the switching thin film 190 as illustrated in FIG. 5A.

Fourth Fabrication Example

FIGS. 11A to 11D are sectional views illustrating a method of fabricating a resistance random access memory device according to a fourth exemplary embodiment of the present inventive concept. The fabricating method of the fourth exemplary embodiment of the inventive concept is equal and similar to that of the first exemplary embodiment of the inventive concept described with reference to FIGS. 8A to 8G or that of the third exemplary embodiment of the inventive concept described with reference to FIGS. 10A to 10D. Accordingly, the same processes will briefly be described or be omitted and different processes will be described in detail.

Figure 11A:
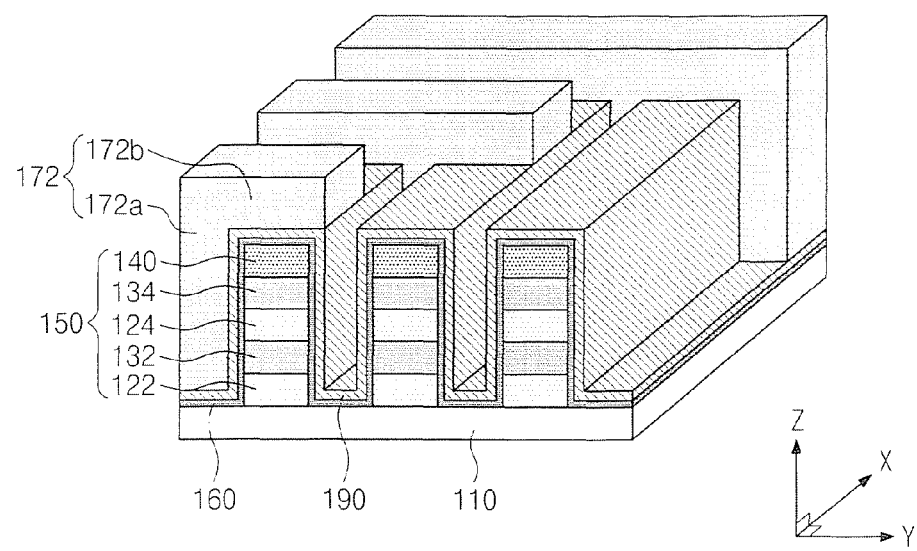
FIGS. 11A to 11D are sectional views illustrating a method of fabricating a resistance random access memory device according to a fourth exemplary embodiment of the present inventive concept.

Referring to FIG. 11A, the plurality of bit-line stacks 150 and the plate-shaped resistance memory thin film 160 may be formed on the substrate 110 in the same or similar process as described with reference to FIGS. 8A to 8C, and the plate-shaped switching thin film 190 may be formed to cover the resistance memory thin film 160. In addition, the plurality of word-lines 172 may be formed on the switching thin film 190 in the same or similar manner as described with reference to FIGS. 8D and 8E.

Figure 11B:
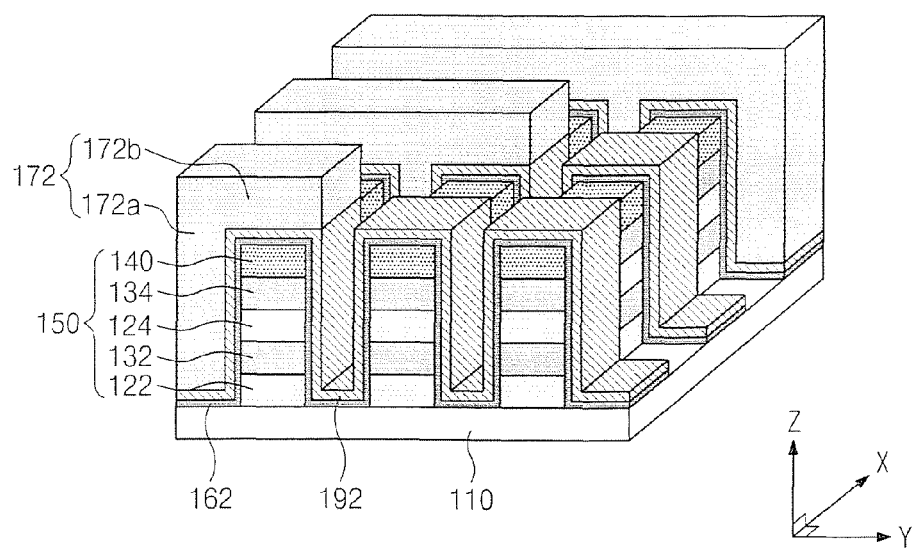

Referring to FIG. 11B, portions of the plate-shaped switching thin film 190 exposed between the word-lines 172 may selectively be removed, thereby forming a strip-shaped switching thin film 192. At the same time or successively, portions of the plate-shaped resistance memory thin film 160 exposed between the word-lines 172 may selectively be removed, thereby forming a strip-shaped resistance memory thin film 162. This allows the plate-shaped switching, thin film 190 and the plate-shaped resistance memory thin film 160 to be embodied as a strip-shaped switching thin film 192 and a strip-shaped resistance memory thin film 162 disposed definitely below the word-line 172. During a selective etching process for forming the strip-shaped resistance memory thin film 162, the bit-line stack 150 may be exposed, but the second conductive layer 134 may be protected by the hard mask pattern 140.

As another example, any one of the plate-shaped switching thin film 190 and resistance memory thin film 160 may be embodied as a strip shape. For instance, portions of the plate-shaped switching thin film 190 exposed between the word-lines 172 may selectively be removed, thereby forming the strip-shaped switching thin film 192. As a result, it can realize the plate-shaped resistance memory thin film 160 and the strip-shaped switching thin film 192 defined between the word-lines 172.

Figure 11C:
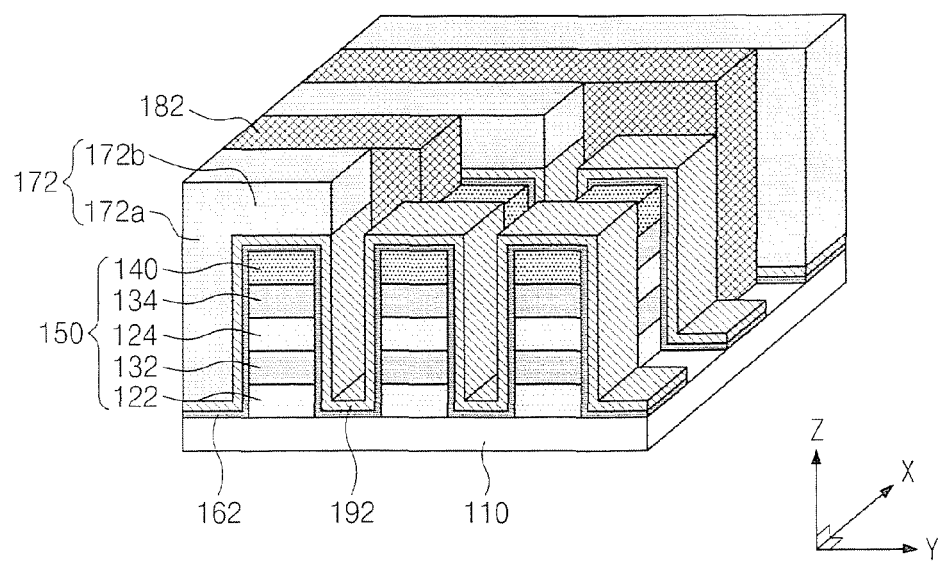
Figure 11D:
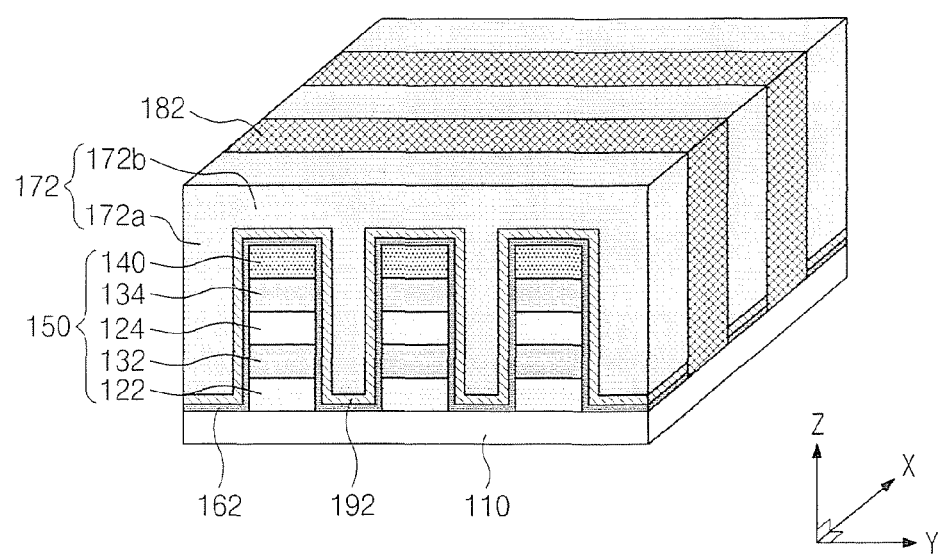

Referring, to FIGS. 11C and 11D, the insulating layer 182 may be formed in the same or similar process as described with reference to FIGS. 8F and 8G, for example, by depositing an insulating, material between the word-lines 172. As a result, it may realize the resistance random access memory device 400 including the strip-shaped switching thin film 192 and the strip-shaped resistance memory thin film 162 as illustrated in FIG. 6A.

Fifth Fabrication Example

FIGS. 12A to 12G are sectional views illustrating a method of fabricating a resistance random access memory device according to a fifth exemplary embodiment of the present inventive concept. The fabricating method of the fifth exemplary embodiment of the inventive concept is equal and similar to that of the first exemplary embodiment of the inventive concept described with reference to FIGS. 8A to 8G. Accordingly, the same processes will briefly be described or be omitted and different processes will be described in detail.

Figure 12A:
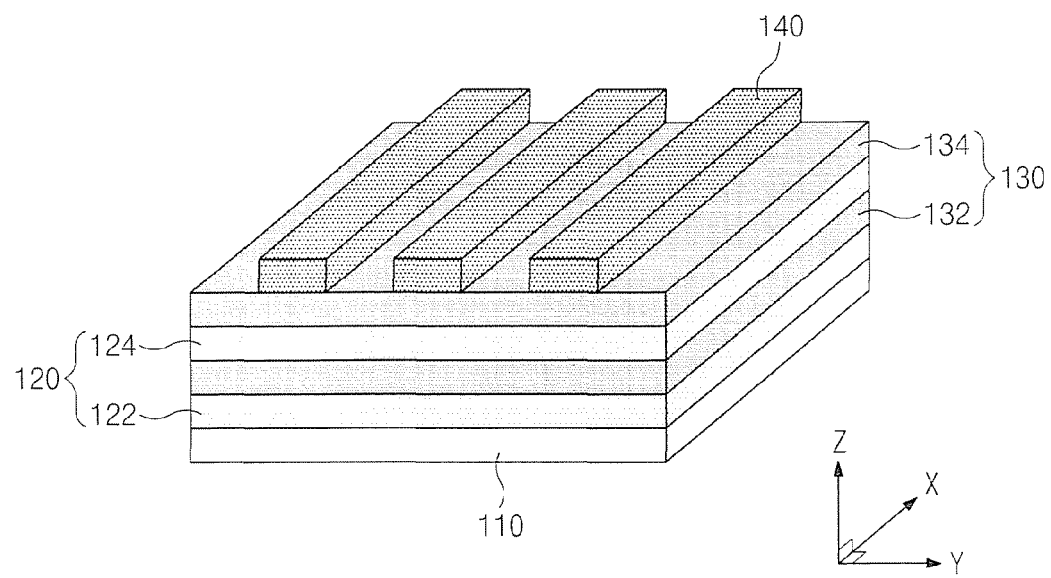
FIGS. 12A to 12G are sectional views illustrating a method of fabricating a resistance random access memory device according to a fifth exemplary embodiment of the present inventive concept.

Referring to FIG. 12A, the insulating layer group 120 provided with the plurality of insulating layers 122 and 124 and the conductive layer group 130 provided with the plurality of conductive layers 132 and 134 may be formed on the substrate 110 in the same or similar process as described with reference to FIG. 8A. The plurality of insulating layers 122 and 124 and the plurality of conductive layers 132 and 134 may alternatively be stacked. The hard mask pattern 140 may be formed on the conductive layer group 130. For instance, the hard mask pattern 140 may extend in the X-axis direction.

Figure 12B:
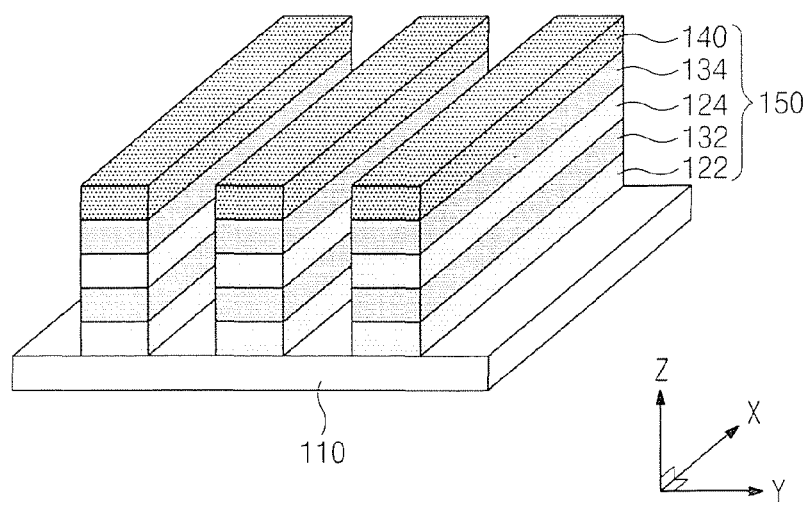

Referring to FIG. 12B, the conductive layer group 130 and the insulating layer group 120 may continuously be patterned in the same or similar process as described with reference to FIG. 8B, for example, by the bit-line etching process (reactive ion etching process) utilizing the hard mask pattern 140 as a mask. As a result, the plurality of bit-line stacks 150 may be provided in the form of a barrier or wall extending in the X-axis direction. The first insulating layer 122, the first conductive layer 132, the second insulating layer 124, and the second conductive layer 134 may be self-aligned by the bit-line etching process.

Figure 12C:
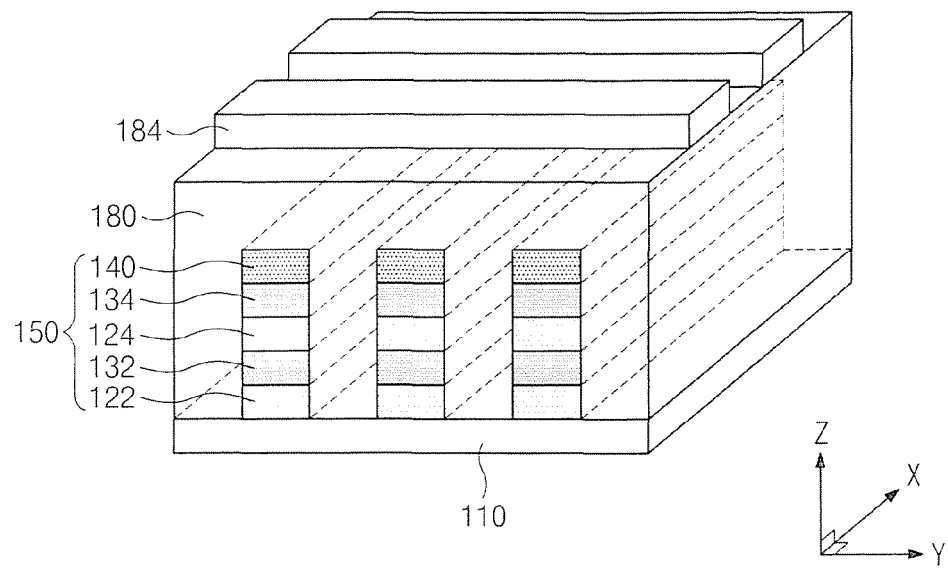

Referring to FIG. 12C, an insulating material layer 180 may be formed on the overall substrate 110, and a mask pattern 184 may be formed on the insulating material layer 180. The insulating material layer 180 may be formed by depositing a silicon oxide (e.g., $SiO_2$). After a photoresist is provided on the insulating material layer 180, the mask pattern 184 may then be formed by patterning the photoresist. The mask pattern 184 may be provided in the form of plural lines extending in the Y-axis direction vertical to the hard mask pattern 140.

Figure 12D:
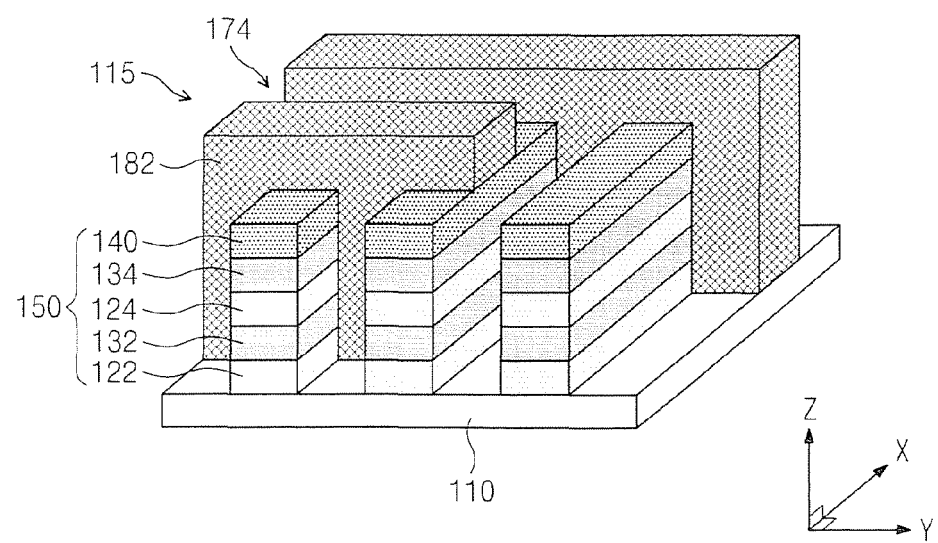

Referring to FIG. 12D, a damascene pattern 115 may be formed by an etching process (trench etching process) using the mask pattern 184 as a mask. A plurality of strip-shaped insulating layers 182 and a plurality of trenches 174 may be formed by selectively removing the insulating material layer 180 through the trench etching process. The insulating layer 182 cover a portion of the bit-line stack 150, and the trench 174 is provided between the insulating layers 182 to expose the bit-line stack 150. The trench 174 provides a region in which the word-lines are formed. The bit-line stack 150 may be protected by the hard mask pattern 140 during the trench etching process. The trench etching process may be a dry etching process, for example, a reactive ion etching process.

Figure 12E:
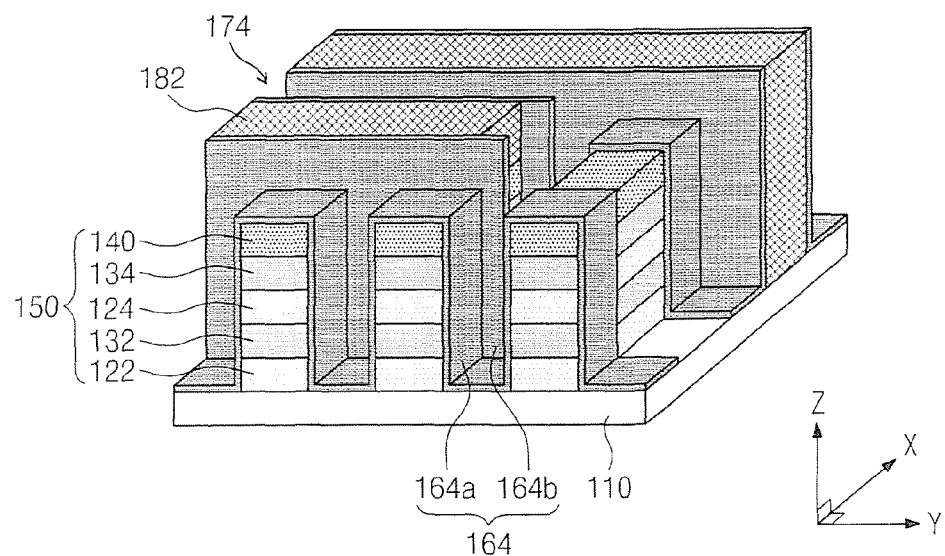

Referring to FIG. 12E, a resistance memory thin film 164 may be formed in the trench 174. For instance, the resistance memory thin film 164 may be formed by depositing colossal magnetoresistance materials, high temperature superconductivity materials, transition metal oxides, or chalcogenides in the trench 174. According to this exemplary embodiment of the inventive concept, the resistance memory thin film 164 may be divided into a first layer 164a and a second layer 164b. The first layer 164a is provided in the form of a strip to cover the bit-line stack 150, while the second layer 164b is provided in the form of a vertical plate at the side of the insulating layer 182.

Figure 12F:
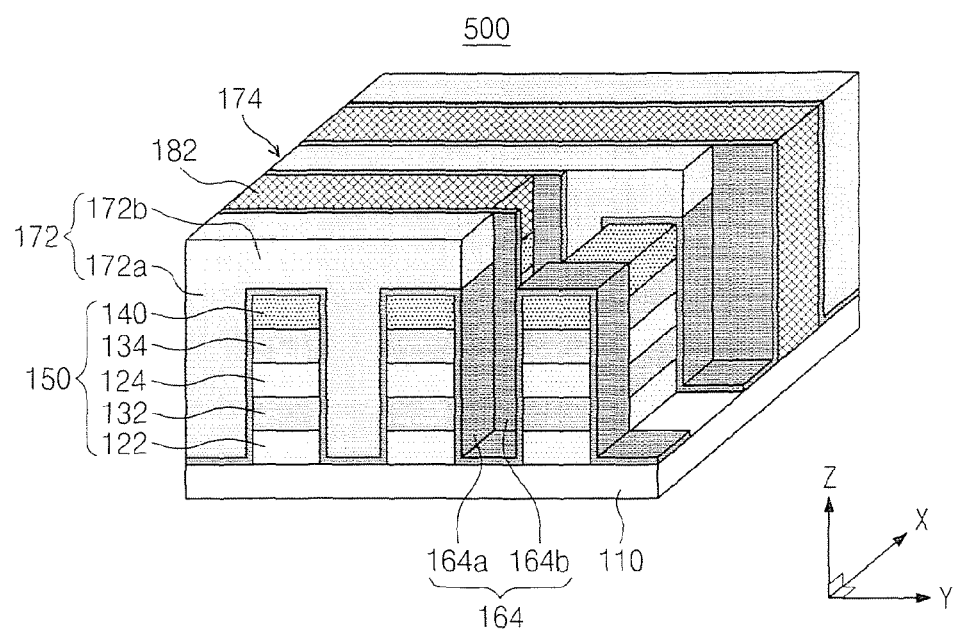
Figure 12G:
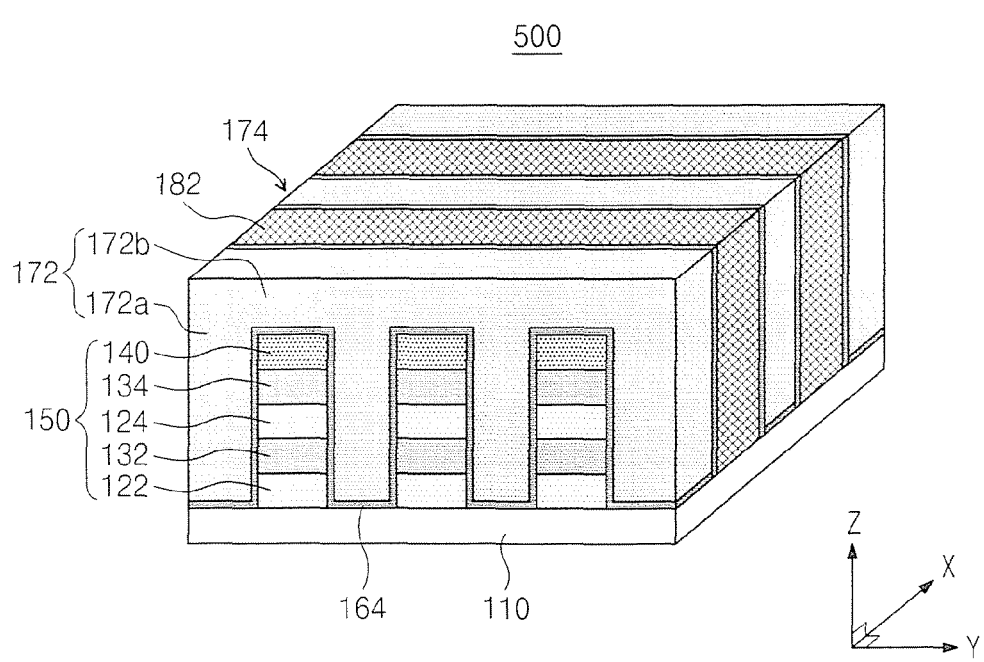

Referring to FIGS. 12F and 12G, the word-line 172 may be formed in the trench 174. The word-line 172 may be provided in the form of a comb extending in the Y-axis direction. For instance, the trench 174 may be filled by depositing a conductive material (e.g., metal or impurity-doped poly silicon) on the substrate 110. Alternatively, the conductive material deposited on the insulating layer 182 may be removed using, a Chemical-Mechanical Polishing, (CMP). As another example, a selective element thin film may further be formed in the trench 174 before the formation of the word-line 172 after the resistance memory thin film 164 is formed. Through the above-described damascene process, it can realize the resistance random access memory device 500 as illustrated in FIG. 7A.

Sixth Fabrication Example

FIGS. 13A to 13G are sectional views illustrating a method of fabricating, a resistance random access memory device according to a sixth exemplary embodiment of the present inventive concept. The fabricating method of the sixth exemplary embodiment of the inventive concept is equal and similar to that of the first exemplary embodiment of the inventive concept described with reference to FIGS. 8A to 8G. Accordingly, the same processes will briefly be described or be omitted and different processes will be described in detail.

Figure 13A:
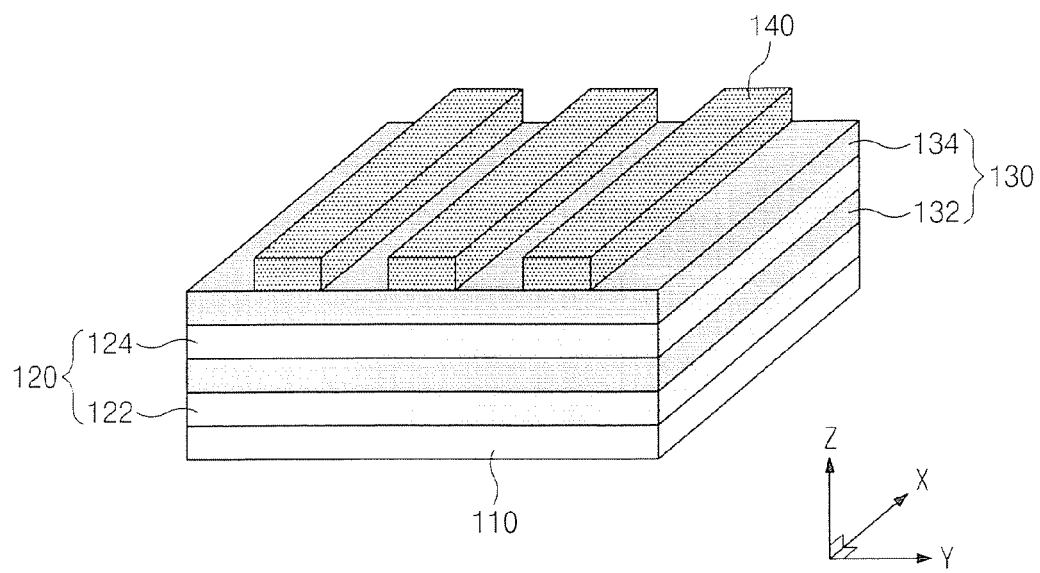
FIGS. 13A to 13G are sectional views illustrating a method of fabricating a resistance random access memory device according to a sixth exemplary embodiment of the present inventive concept.

Referring to FIG. 13A, the insulating layer group 120 provided with the plurality of insulating layers 122 and 124 and the conductive layer group 130 provided with the plurality of conductive layers 132 and 134 may be formed on the substrate in the same or similar process as described with reference to FIG. 8A. The plurality of insulating layers 122 and 124 and the plurality of conductive layers 132 and 134 may alternatively be stacked. The hard mask pattern 140 extending, in the X-axis direction may be formed on the conductive layer group 130.

Figure 13B:
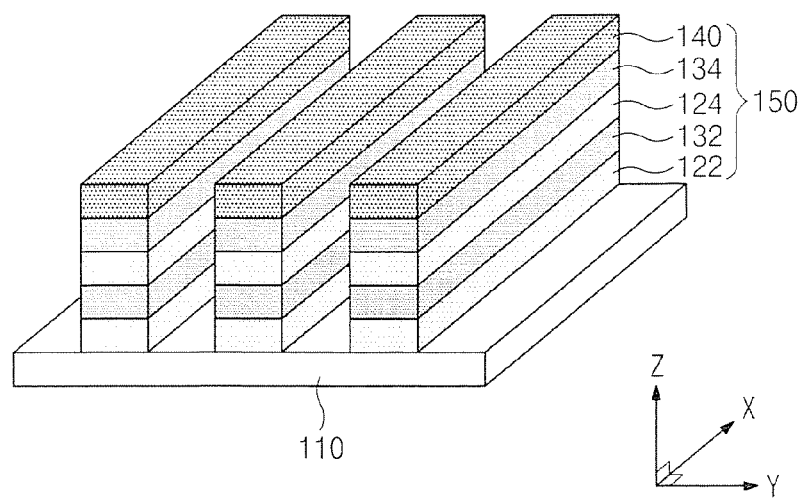

Referring to FIG. 13B, the conductive layer group 130 and the insulating layer group 120 may continuously be patterned in the same or similar process as described with reference to FIG. 8B, for example, by the bit-line etching process (reactive ion etching process) utilizing the hard mask pattern 140 as a mask. The plurality of bit-line stacks 150 may be provided in the form of a barrier or wall extending in the X-axis direction. The first insulating layer 122, the first conductive layer 132, the second insulating layer 124, and the second conductive layer 134 may be self-aligned by the bit-line etching process.

Figure 13C:
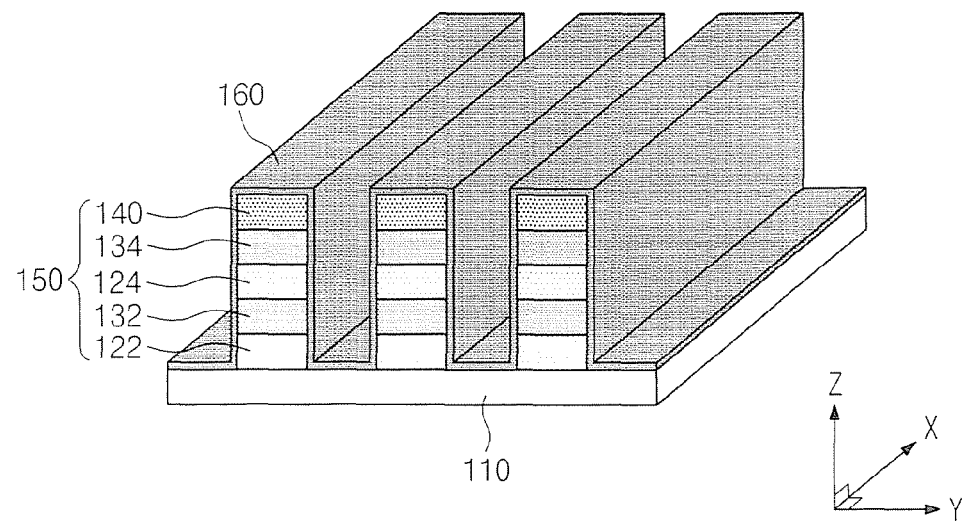

Referring to FIG. 13C, the resistance memory thin film 160 may be formed in the same or similar process as described with reference to FIG. 8C, for example, by depositing the resistive memory materials on the substrate 110 to cover the bit-line stack 150. The resistance memory thin film 160 may cover as uniformly as possible the bit-line stack 150 through a chemical vapor deposition process. Alternatively, the switching thin film may further be formed on the resistance memory thin film 160.

Figure 13D:
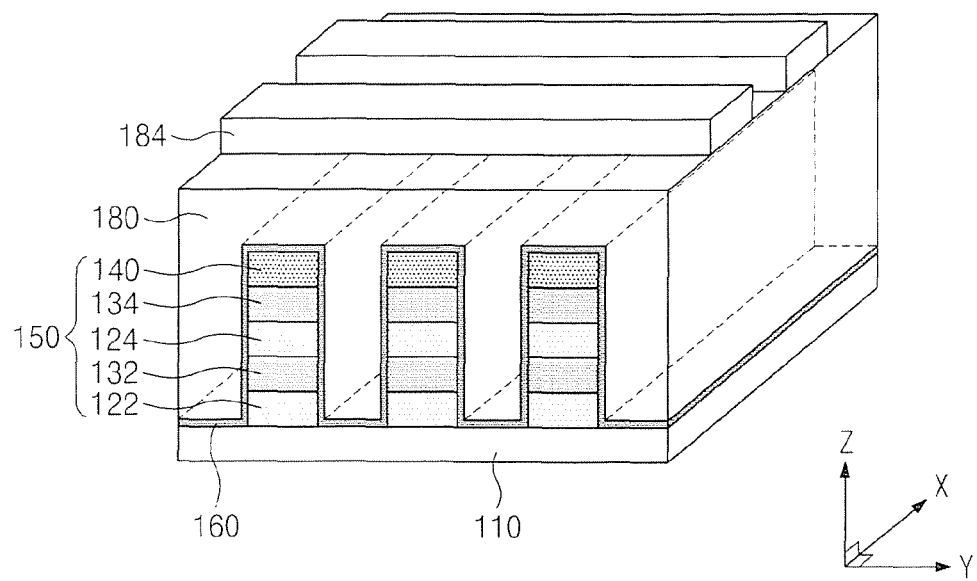

Referring to FIG. 13D, the insulating material layer 180 may be formed on the substrate 110, and the mask pattern 184 may be formed on the insulating material layer 180. The insulating material layer 180 may be formed by depositing a silicon oxide (e.g., $SiO_2$). After a photoresist is provided on the insulating material layer 180, the mask pattern 184 may then be formed by patterning the photoresist. The mask pattern 184 may be provided in the form of plural lines extending in the Y-axis direction vertical to the hard mask pattern 140.

Figure 13E:
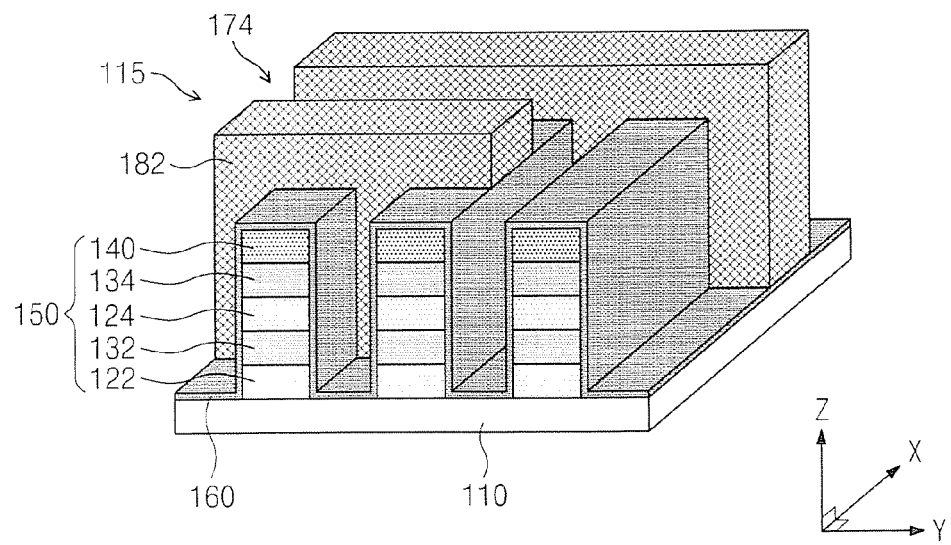

Referring to FIG. 13E, the damascene pattern 115 may be formed by an etching process (trench etching, process) using the mask pattern 184 as a mask. A plurality of strip-shaped insulating layers 182 and a plurality of trenches 174 may be formed by selectively removing the insulating material layer 180 through the trench etching process. The insulating layer 182 cover a portion of the bit-line stack 150, and the trench 174 is provided between the insulating layers 182 to expose the bit-line stack 150.

Figure 13F:
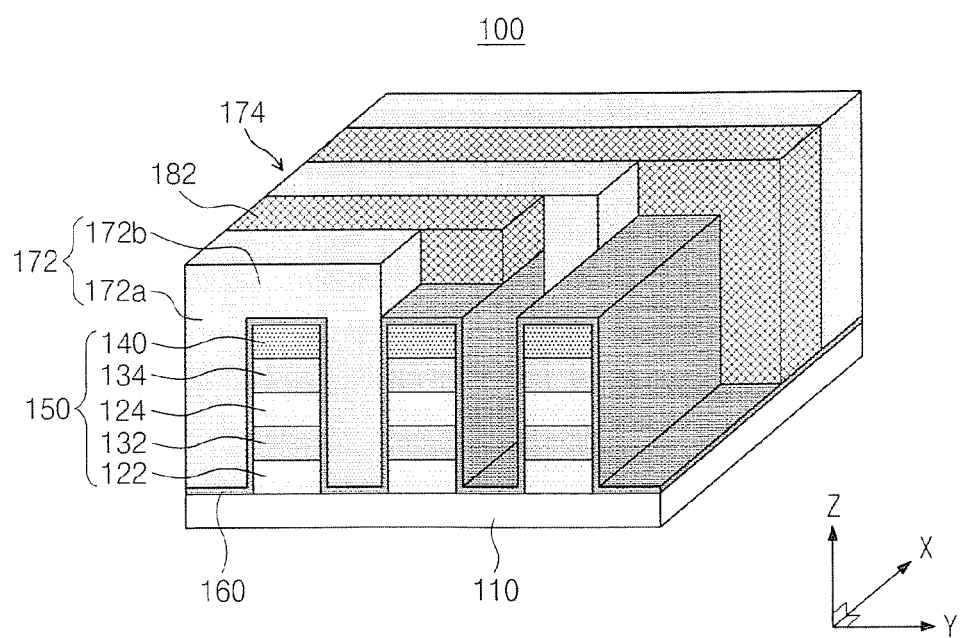
Figure 13G:
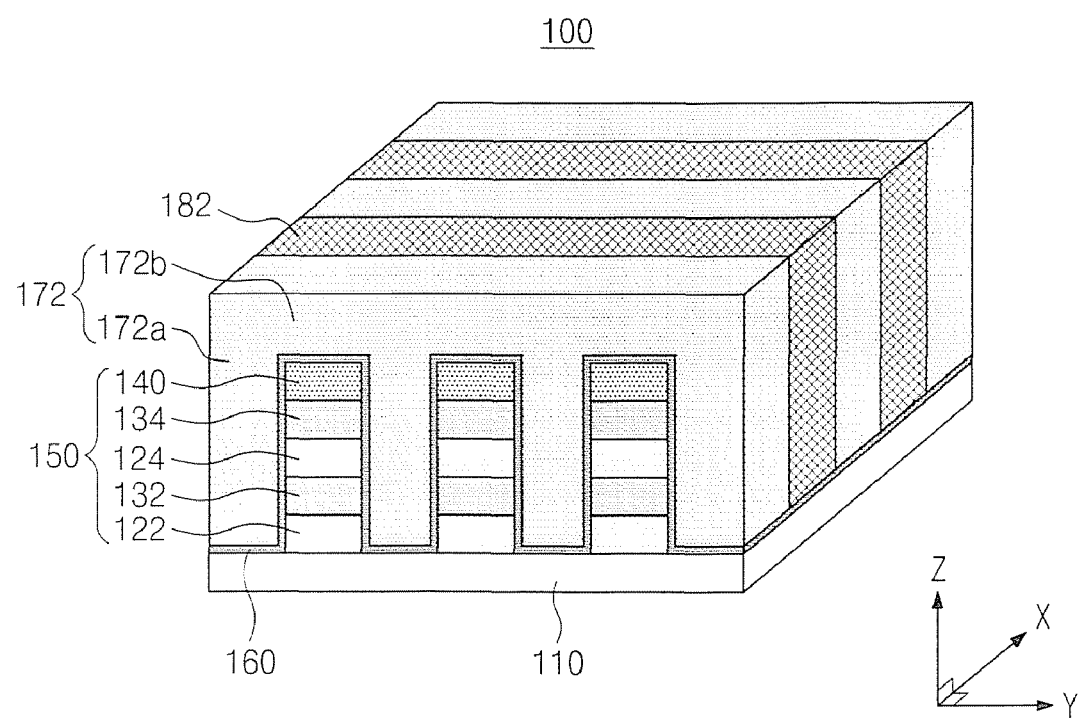

Referring, to FIGS. 13F and 13G, the word-line 172 may be formed in the trench 174. The word-line 172 may be provided in the form of a comb extending in the Y-axis direction. For instance, the trench 174 may be filled by depositing a conductive material (e.g., metal or impurity-doped poly silicon) on the substrate 110. Alternatively, the conductive material deposited on the insulating layer 182 may be removed using a Chemical-Mechanical Polishing (CMP). Through the above-described damascene process, it can realize the resistance random access memory device 100 as illustrated in FIG. 3A.

Applicable Example

Figure 15A:
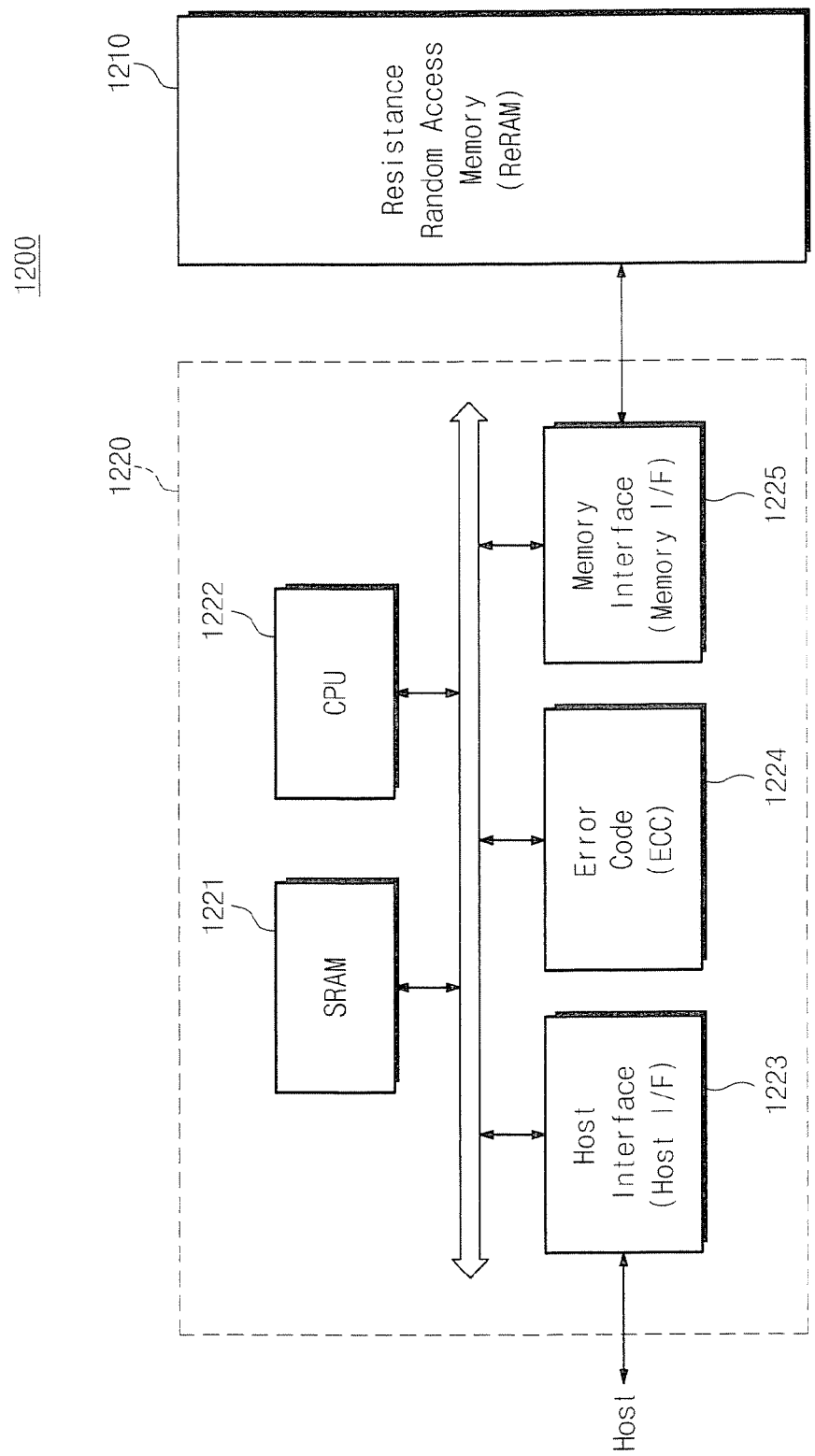
FIG. 15A is a block diagram illustrating a memory card including the resistance random access memory device according to the exemplary embodiments of the present inventive concept.

FIG. 15A is a block diagram illustrating a memory card including the resistance random access memory device according to the exemplary embodiments of the present inventive concept.

With reference to FIG. 15A, a resistance random access memory 1210 according to various exemplary embodiments of the inventive concept may be applicable to a memory card 1200. For example, the memory card 1200 includes a memory controller 1220 for controlling data exchange as a whole between a host and the resistance random access memory 1210. An SRAM 1221 is used as an operation memory of a central processing, unit 1222. A host interface 1223 has a data exchanging protocol of the host connected to the memory card 1200. An error correction code 1224 detects and corrects errors in the data read from the resistance random access memory 1210. A memory interface 1225 interfaces the resistance random access memory 1210. The central processing unit 1222 executes a control operation for exchanging data of the memory controller 1220 as a whole.

Figure 15B:
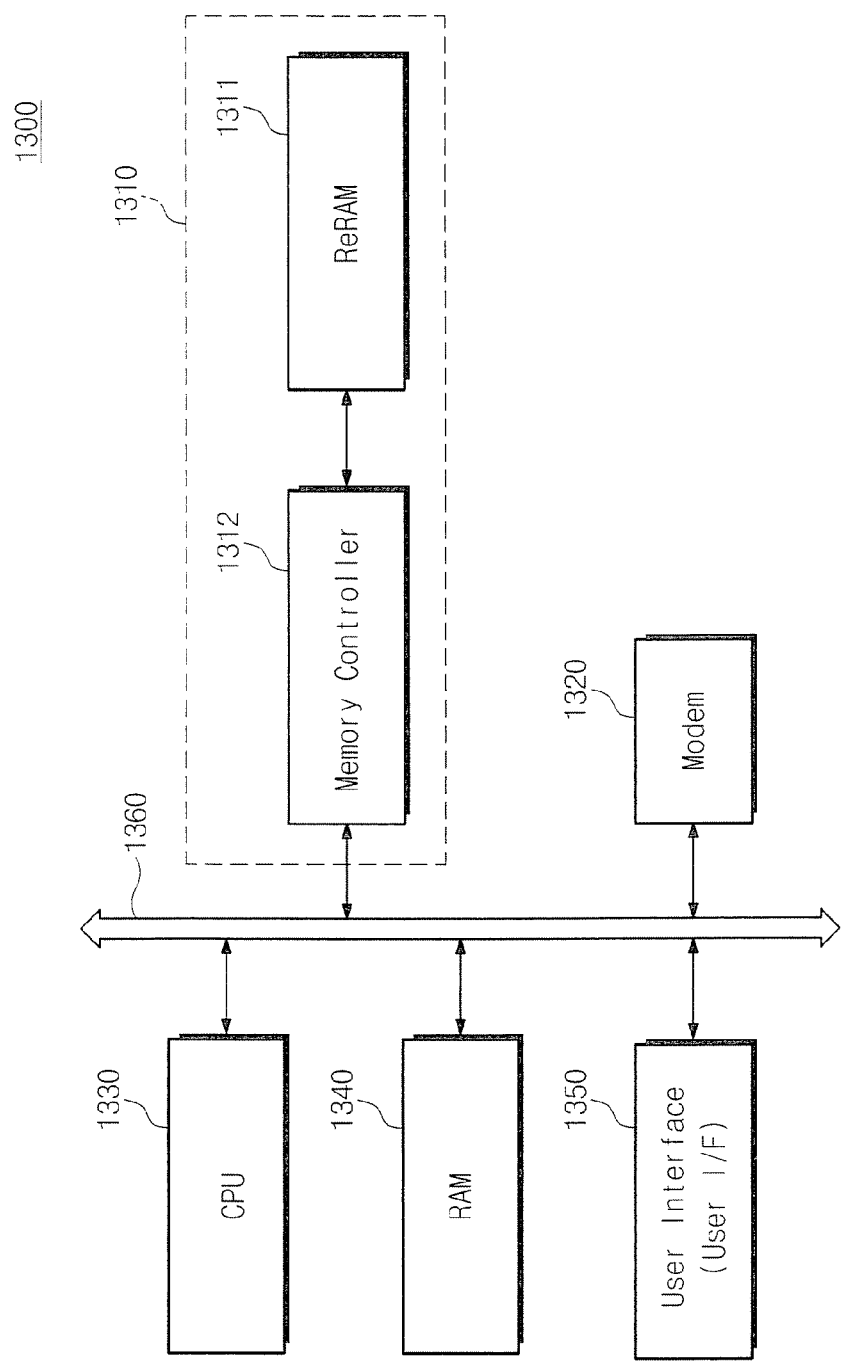
FIG. 15B is a block diagram illustrating an information processing system adapting the resistance random access memory device according to the exemplary embodiments of the present inventive concept.

FIG. 15B is a block diagram illustrating an information processing system adapting the resistance random access memory device according to the exemplary embodiments of the present inventive concept.

With reference to FIG. 15B, the information processing system 1300 may include a memory system 1310 provided with the resistance random access memory device according to the exemplary embodiments of the inventive concept. The information processing system 1300 includes a mobile apparatus or a computer. For example, the information processing system 1300 further includes a modem 1320, a central processing unit 1330, a RAM 1340, and a user interface 1350 that are electrically connected to the memory system 1310 through the system bus 1360. The memory system 1310 may store data processed by the central processing unit 1330 or data input from the outside. The information processing system 1300 may be provided as a solid static disk (SSD), a camera image sensor, and other application chipsets. For example, the memory system 1310 may be configured as the solid static disk. In this case, the information processing system 1300 may stably and reliably store a mass data in the memory system 1310.

According to the present inventive concept, the bit-lines may vertically be stacked by a single etching process, and the comb-shaped word-lines intersecting the bit-lines at a right angle may be formed by a single etching process. As a result, the 3D cross-point architecture may be formed by the number of process steps required for forming one memory layer, resulting in realizing a highly dense multi-layered memory array with simplified processes. Moreover, since the comb-shaped word-lines are formed, the number of word-lines can be reduced, resulting in reducing the number of decoders connected to the word-lines. Therefore, it can simplify the process and reduce the size of device.

The present inventive concept may be useful used for not only a semiconductor industry for fabricating a semiconductor memory device but also a manufacturing industry for producing electronic products to which the semiconductor memory device is applied.

Although the present inventive concept has been described in connection with the embodiment of the present inventive concept illustrated in the accompanying drawings, it is not limited thereto. It will be apparent to those skilled in the art that various substitution, modifications and changes may be thereto without departing from the scope and spirit of the inventive concept.

What is claimed is:

1. A method of fabricating a variable-resistance random access memory device, comprising:
    forming a vertical stack of bit lines on a substrate;
    forming a first word line on a first sidewall of the vertical stack of bit lines by:
        depositing an electrically conductive layer on the vertical stack of bit lines; and
        patterning the electrically conductive layer to define the first word line on the first sidewall and a second word line on a second sidewall of the vertical stack of bit lines; and
    forming a variable resistance thin-film between the first sidewall and the first word line.

2. The method of claim 1, wherein said forming the vertical stack comprises forming a vertical stack of bit lines and insulating layers arranged in an alternating bit line and insulating layer sequence.

3. A method of fabricating a variable-resistance random access memory device, comprising:
    forming a vertical stack of bit lines on a substrate;
    forming a first word line on a first sidewall of the vertical stack of bit lines by:
        depositing an electrically conductive layer on the vertical stack of bit lines; and
        patterning the electrically conductive layer to define a global word line that overlaps the vertical stack of bit lines and further define a second local word line on a second sidewall of the vertical stack of bit lines; and
    forming a variable resistance thin-film between the first sidewall and the first word line.

4. The method of claim 1, wherein said forming a vertical stack of bit lines comprises forming first and second vertical stacks of bit lines at side-by-side locations on the substrate; and wherein said forming a first word line comprises forming the first word line on a first sidewall of the first vertical stack of bit lines and on a first sidewall of the second vertical stack of bit lines.

5. The method of claim 4, wherein said forming a variable resistance thin-film comprises forming the variable resistance thin-film between the first sidewall of the first vertical stack and the first word line and between the first sidewall of the second vertical stack and the first word line.

6. A method of fabricating a variable-resistance random access memory device, comprising:
    forming a vertical stack of bit lines on a substrate;
    forming a first word line on a first sidewall of the vertical stack of bit lines;
    forming a variable resistance thin-film between the first sidewall and the first word line; and
    forming a switching thin film between the variable resistance thin-film and the first word line.

7. The method of claim 6, wherein the switching thin film has unidirectional current transfer characteristics.

8. The method of claim 6, wherein the switching thin film is configured to form a plurality of diodes between the first word line and a plurality of bit lines in the vertical stack.

9. A method of fabricating a resistance random access memory device, the method comprising:
   forming a bit-line stack in which a plurality of local bit-lines are vertically stacked on a substrate;
   forming a word-line including a plurality of local word-lines that extend in a vertical direction toward a side of the bit-line stack and a connection line that extends in a horizontal direction to connect the plurality of local word-lines with one another; and
   forming a resistance memory thin film between the bit-line stack and the word-line.

10. The method as set forth in claim 9, further comprising:
    forming the bit-line stack;
    forming the resistance memory thin film that covers the bit-line stack;
    depositing a conductive material on the resistance memory thin film; and
    forming the word-line by patterning the conductive material.

11. The method as set forth in claim 9, further comprising:
    forming the bit-line stack;
    forming the resistance memory thin film that covers the bit-line stack;
    depositing an insulating material on the resistance memory thin film;
    forming a trench that exposes the resistance memory thin film by patterning the insulating material; and
    forming the word-line by depositing a conductive material in the trench.

12. The method as set forth in claim 9, further comprising:
    forming the bit-line stack;
    depositing an insulating material on the substrate;
    forming a trench that exposes the bit-line stack by patterning the insulating material;
    forming the resistance memory thin film in the trench; and
    forming the word-line on the resistance memory thin film by depositing a conductive material in the trench.

13. The method as set forth in claim 9, further comprising forming a switching thin film between the resistance memory thin film and the word-line.

14. The method as set forth in claim 9, wherein the forming of the bit-line stack includes:
    forming a stacked body in which a plurality of insulating layers and a plurality of conductive layers are alternatively disposed on the substrate;
    forming a hard mask pattern on the stacked body; and
    patterning the stacked body by an etching using the hard mask pattern as a mask.

* * * * *